(12) United States Patent
Fujii et al.

(10) Patent No.: US 7,811,669 B2
(45) Date of Patent: Oct. 12, 2010

(54) GAS BARRIER LAMINATED FILM AND PROCESS FOR PRODUCING THE SAME

(75) Inventors: Hitoshi Fujii, Kasukabe (JP); Norio Akita, Tokyo-To (JP); Ayumi Shibata, Tokyo-To (JP); Daidou Chiba, Shirakawa (JP); Koichi Mikami, Saitama (JP); Hisashi Sakamoto, Hachioji (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 11/573,924

(22) PCT Filed: Aug. 15, 2005

(86) PCT No.: PCT/JP2005/014926

§ 371 (c)(1),
(2), (4) Date: Apr. 3, 2007

(87) PCT Pub. No.: WO2006/019083

PCT Pub. Date: Feb. 23, 2006

(65) Prior Publication Data

US 2007/0269664 A1    Nov. 22, 2007

(30) Foreign Application Priority Data

Aug. 17, 2004 (JP) ............................. 2004-236996
Aug. 17, 2004 (JP) ............................. 2004-237598
Nov. 17, 2004 (JP) ............................. 2004-333220
Feb. 16, 2005 (JP) ............................. 2005-039758

(51) Int. Cl.
*B32B 9/00* (2006.01)
*B32B 27/08* (2006.01)
*B65D 1/00* (2006.01)
*C23C 16/42* (2006.01)
*C23C 14/08* (2006.01)

(52) U.S. Cl. ............. 428/451; 427/255.18; 427/255.19; 427/489; 427/533; 427/536; 427/539; 427/585; 428/35.4; 428/36.6; 428/36.7; 428/347; 428/349; 428/423.5; 428/423.7; 428/424.2; 428/476.3; 428/480; 428/483; 428/520

(58) Field of Classification Search ................. 428/451, 428/35.4, 36.6, 36.7, 347, 349, 423.5, 423.7, 428/424.2, 476.3, 480, 483, 520; 427/255.18, 427/255.19, 489, 533, 536, 539, 585
See application file for complete search history.

(56) References Cited

U.S. PATENT DOCUMENTS

| 5,804,300 | A  | * | 9/1998 | Maro et al. ................. 428/335 |
| 6,602,564 | B1 | * | 8/2003 | Komori et al. ............. 428/34.9 |
| 2001/0038894 | A1 | * | 11/2001 | Komada .................... 428/34.6 |
| 2004/0115445 | A1 | * | 6/2004 | Sasaki et al. ................ 428/451 |

FOREIGN PATENT DOCUMENTS

EP          0 960 901      12/1999

(Continued)

OTHER PUBLICATIONS

Supplementary European Search Report, Apr. 29, 2010.*

*Primary Examiner*—D. S Nakarani
(74) *Attorney, Agent, or Firm*—Burr & Brown

(57) ABSTRACT

There are provided a gas barrier laminated film, which is transparent while possessing excellent gas barrier properties and, at the same time, has excellent impact resistance, and a process for producing the same. The gas barrier laminated film comprises a base material, a vapor deposited film of an inorganic oxide provided on the base material, and a gas barrier coating film provided on the vapor deposited film. The gas barrier laminated film is characterized in that the base material on its side where the vapor deposited film is provided, has been subjected to pretreatment or primer coating treatment, and the gas barrier coating film has been formed by coating a gas barrier coating liquid onto the inorganic oxide film and then heating the coating.

27 Claims, 4 Drawing Sheets

FOREIGN PATENT DOCUMENTS

| | | |
|---|---|---|
| JP | 07-080986 | 3/1995 |
| JP | 07-164591 | 6/1995 |
| JP | 2000-071396 | 3/2000 |
| JP | 2000-127285 | 5/2000 |
| JP | 2000-127286 | 5/2000 |
| JP | 2000-263681 | 9/2000 |
| JP | 2003-276111 | 9/2003 |

* cited by examiner

GAS BARRIER LAMINATED FILM AND PROCESS FOR PRODUCING THE SAME

TECHNICAL FIELD

The present invention relates to a gas barrier laminated film and a process for producing the same. More particularly, the present invention relates to a gas barrier laminated film, which is transparent while possessing excellent gas barrier properties and, at the same time, has excellent impact resistance, and a process for producing the same.

BACKGROUND ART

Packaging materials comprising an aluminum foil layer provided on a base material have hitherto been used as packaging materials having gas barrier properties. These packaging materials have stable gas barrier properties, but on the other hand, due to the provision of an aluminum foil layer as a barrier layer, the level of suitability for incineration is so low that the disposal after use is not easy. Further, since the packaging material is provided with the aluminum foil layer, disadvantageously, the packaging material is not transparent.

In order to solve such problems, a packaging material comprising a barrier layer formed of polyvinylidene chloride (PVDC) or an ethylene-vinyl alcohol copolymer (EVOH) has been developed.

Since, however, PVDC contains chlorine, incineration after use generates chlorine gas which is disadvantageous from the viewpoint of environmental hygiene. EVOH advantageously has a high level of oxygen gas barrier properties and has a low level of flavor compound adsorption, but on the other hand, the oxygen gas barrier properties are disadvantageously lowered under a high-humidity atmosphere. Further, EVOH involves an additional problem that it does not have water vapor barrier properties. To overcome these problems, a complicated laminated structure should be adopted in the packaging material for shielding the EVOH as the barrier layer from water vapor. This may disadvantageously lead to increased production cost.

In recent years, films comprising a barrier layer formed of a thin film of an inorganic oxide such as silicon oxide or aluminum oxide have been developed as packaging materials that stably exhibit a high level of gas barrier properties and a high level of aroma retaining properties and, at the same time, are transparent. This thin film of an inorganic oxide is formed by depositing the inorganic material onto a base material by vacuum vapor deposition. Accordingly, these films do not involve any environmental problem in the disposal and, further, there is no dependence of gas barrier properties upon humidity.

Since the barrier layer formed of a thin film of, for example, silicon oxide or aluminum oxide is formed by vapor depositing inorganic oxide particles on a base material, gaps called crystal grain boundaries exist among the inorganic oxide particles. Accordingly, the gas barrier properties of the thin film are unsatisfactory. In order to overcome this drawback, the film thickness should be increased (500 to 1000 angstroms). Increasing the film thickness, however, poses problems of poor malleability and high susceptibility to cracking.

The lower the proportion of oxygen atom in the inorganic oxide, the better the level of gas barrier properties. However, various problems occur such as a deterioration in transparency and poor adhesion between the substrate and the inorganic oxide particles.

To overcome the problems, a proposal has been made in which a coating film having gas barrier properties is provided on the vapor deposited film surface to improve gas barrier properties (Japanese Patent Laid-Open No. 80986/1995). A polymer containing a polar group such as a hydroxyl group, which has high crystallinity and high polymer cohesive energy density, is used as the material for this coating film. Specific examples thereof include polyvinyl alcohols and ethylene-vinyl alcohol copolymers. The adoption of a laminated structure of a vapor deposited layer and a gas barrier coating film can improve the gas barrier properties and can solve the above problems.

Polar groups such as a hydroxyl group and an amide group, however, are likely to bond to water molecules, and the gas barrier properties are deteriorated as the environmental humidity enhances. That is, when the contents of a pack formed of the film are a water-containing liquid or a water-containing food, the gas barrier properties are deteriorated due to the influence of water vapor or the like in the contents, disadvantageously leading to deteriorated quality of the contents during storage.

Further, for some foods, after filling food into a pack, the packed food is generally subjected to sterilization with hot water by boiling or retorting. The above gas barrier material, however, undergoes a deterioration in gas barrier properties and a deterioration in mechanical strength such as adhesive strength during the treatment and thus is not suitable for use in the treatment method.

DISCLOSURE OF THE INVENTION

Problems to be Solved by the Invention

The present invention has been made under such circumstances, and an object of the present invention is to provide a gas barrier laminated film, which is transparent while possessing excellent gas barrier properties and, at the same time, has excellent impact resistance, and a process for producing the same.

Means for Solving the Problems

The above object is attained by a gas barrier laminated film comprising a base material, a vapor deposited film of an inorganic oxide provided on the base material, and a gas barrier coating film provided on the vapor deposited film, said base material on its side where the vapor deposited film is provided, has been subjected to pretreatment or primer coating treatment, and said gas barrier coating film has been formed by coating a gas barrier coating liquid onto the inorganic oxide film and then heating the coating.

According to the present invention, there is also provided a process for producing a gas barrier laminated film, characterized by comprising the steps of:

providing a base material and subjecting one side of the base material to pretreatment or primer coating treatment, forming a vapor deposited film of an inorganic oxide on the treated surface of the base material, and coating a gas barrier coating liquid onto the vapor deposited film and heating the coating at 150 to 250° C. to form a gas barrier coating film.

The present invention can provide a gas barrier laminated film which is transparent while possessing excellent gas barrier properties and, at the same time, has excellent impact resistance.

BEST MODE FOR CARRYING OUT THE INVENTION

The gas barrier laminated film according to the present invention will be described in more detail with reference to the accompanying drawings.

Figure 1:
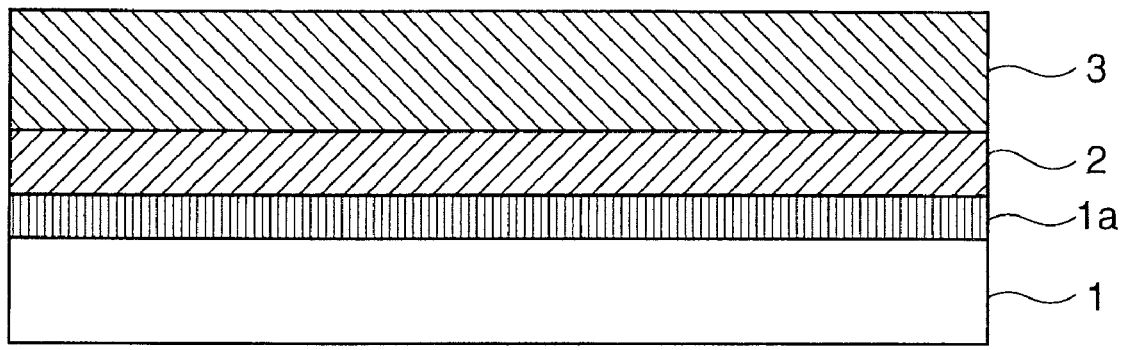
FIG. 1 is a typical cross-sectional view showing one embodiment of the layer construction of the gas barrier laminated film according to the present invention.
Figure 2:
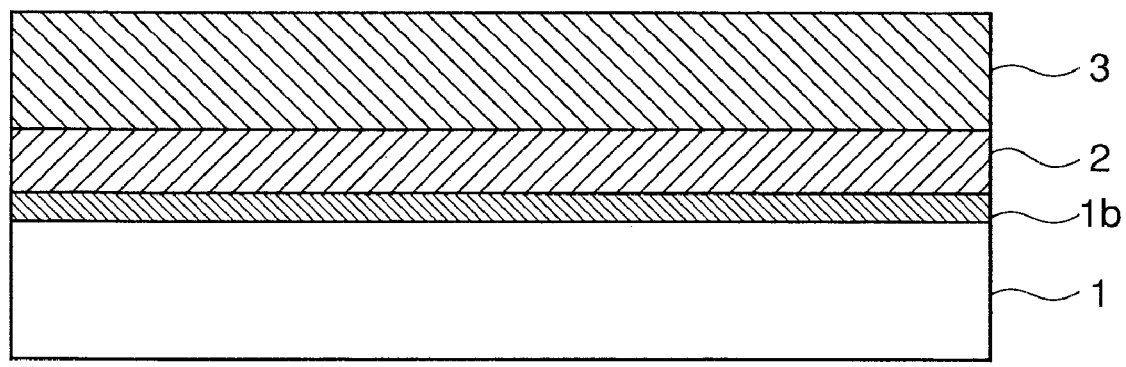
FIG. 2 is a typical cross-sectional view showing another embodiment of the layer construction of the gas barrier laminated film according to the present invention.

FIGS. 1 and 2 are schematic cross-sectional views showing embodiments of the layer construction of the gas barrier laminated film according to the present invention.

As shown in FIG. 1, the gas barrier laminated film according to the present invention has a basic structure comprising a base material film 1 having one treated surface 1a, a vapor deposited film 2 of an inorganic oxide provided on the surface treated surface 1a, and a gas barrier coating film 3 provided on the inorganic oxide vapor deposited film 2.

FIG. 2 shows another embodiment of the gas barrier laminated film according to the present invention. This gas barrier laminated film has a basic structure comprising a base material film 1, a primer coating layer 1b provided on one side of the base material film 1, a vapor deposited film 2 of an inorganic oxide provided on the primer coating layer 1b, and a gas barrier coating film 3 provided on the vapor deposited film 2 of an inorganic oxide.

The above embodiments are an example of the gas barrier laminated film according to the present invention, and the present invention is not limited to these embodiments.

For example, in the laminated film according to the present invention, the inorganic oxide vapor deposited film may have a multilayer structure of two or more vapor deposited films of the same type of or dissimilar inorganic oxides (not shown).

Next, materials constituting the gas barrier laminated film according to the present invention and a production process thereof and the like will be described.

Base Material

A resin film or sheet, which has excellent chemical or physical strength, can withstand, for example, conditions for the formation of the vapor deposited film of an inorganic oxide, and can well hold the vapor deposited film of an inorganic oxide and the like without sacrificing the properties of the vapor deposited film and the like, may be used as a base material constituting the gas barrier laminated film according to the present invention.

Specific examples of such resin films or sheets include films or sheets of various resins, for example, polyolefin resins such as polyethylene resins or polypropylene resins, cyclic polyolefin resins, polystyrene resins, acrylonitrile-styrene copolymers (AS resins), acrylonitrile-butadiene-styrene copolymers (ABS resins), poly(meth)acrylic resins, polycarbonate resins, polyester resins such as polyethylene terephthalate and polyethylene naphthalate, polyamide resins such as various types of nylon, polyurethane resins, acetal resins, and cellulosic resins.

In the present invention, among the above resin films or sheets, films or sheets of polyester resins, polyolefin resins, or polyamide resins are particularly preferred.

In the present invention, various resin films or sheets produced, for example, by a film forming method in which a film is formed using one or more of the above various resins solely by extrusion, cast molding, T-die molding, machining, or inflation, or other film forming methods such as a film forming method in which a film is formed using two or more various resins by multilayer coextrusion, or a film forming method in which two or more resins are provided and mixed together before film formation. If necessary, the produced resin films or sheets may be stretched monoaxially or biaxially, for example, by a tenter method or a tubular method.

In the present invention, the thickness of various resin films or sheets is preferably about 6 to 200 μm, more preferably about 9 to 100 μm.

In the formation of a film using one or more of the various resins, for example, various plastic compounding agents or additives may be added from the viewpoints of improving or modifying film moldability, heat resistance, weathering resistance, mechanical properties, dimensional stability, antioxidative properties, slipperiness, releasability, flame retardancy, antifungal properties, electric properties, strength and the like. The addition amount thereof may be any amount in the range of a very small amount to several tens of percent depending upon the purpose of the addition of the plastic compounding agents or additives.

Conventional additives usable herein include, for example, lubricants, crosslinking agents, antioxidants, ultraviolet absorbers, photostabilizers, fillers, reinforcing agents, antistatic agents, and pigments. Resins for modification and the like may also be used.

Further, in the present invention, if necessary, a desired surface treatment layer may be previously provided on the surface of various resin films or sheets, for example, from the viewpoint of improving the adhesion between the resin film or sheet and the vapor deposited film of an inorganic oxide.

In the present invention, regarding the surface treatment layer, for example, pretreatment such as corona discharge treatment, ozone treatment, low-temperature plasma treatment using an oxygen gas, a nitrogen gas or the like, glow discharge treatment, or oxidation treatment using chemicals is carried out to form, for example, a corona treated layer, an ozone treated layer, a plasma treated layer, or an oxidation treated layer.

The above surface pretreatment is carried out as a method for improving, for example, the adhesion between various resin films or sheets and the vapor deposited film of an inorganic oxide. In order to improve the adhesion, for example, a primer coating agent layer, an undercoating agent layer, an anchor coating agent layer, an adhesive layer, or a vapor deposited anchor coating agent layer may also be previously formed as a surface treatment layer on the surface of various resin films or sheets.

The coating agent layer for the pretreatment may be formed of, for example, a resin composition comprising a vehicle composed mainly of, for example, a polyolefin resin such as a polyester resin, a polyamide resin, a polyurethane resin, an epoxy resin, a phenolic resin, an (meth)acrylic resin, a polyvinyl acetate resin, polyethylene or polypropylene, or a copolymer or modification product of the polyolefin resin, or a cellulosic resin.

Vapor Deposited Film

Next, the vapor deposited film constituting the gas barrier laminated film will be described. In the present invention, the vapor deposited film may be formed by a chemical vapor deposition method or a physical vapor deposition method.

Formation of Vapor Deposited Film by Chemical Vapor Deposition Method

Specific examples of chemical vapor deposition methods (CVD methods) include plasma chemical vapor deposition, thermal chemical vapor deposition, and photochemical vapor deposition.

More specifically, the vapor deposited film of an inorganic oxide such as silicon oxide may be formed on one side of the resin film or sheet by a low-temperature plasma chemical vapor deposition method in which a monomer gas for vapor deposition such as an organosilicon compound is used as a starting material, an inert gas such as argon gas or helium gas is used as a carrier gas, and oxygen is used as feed gas, and a low-temperature plasma generator and the like are used.

Generators such as high-frequency plasma, pulse wave plasma, and microwave plasma generators may be used as the low-temperature plasma generator. In the present invention, the use of the high-frequency plasma-type generator is preferred for the generation of highly active and stable plasma.

Figure 3:
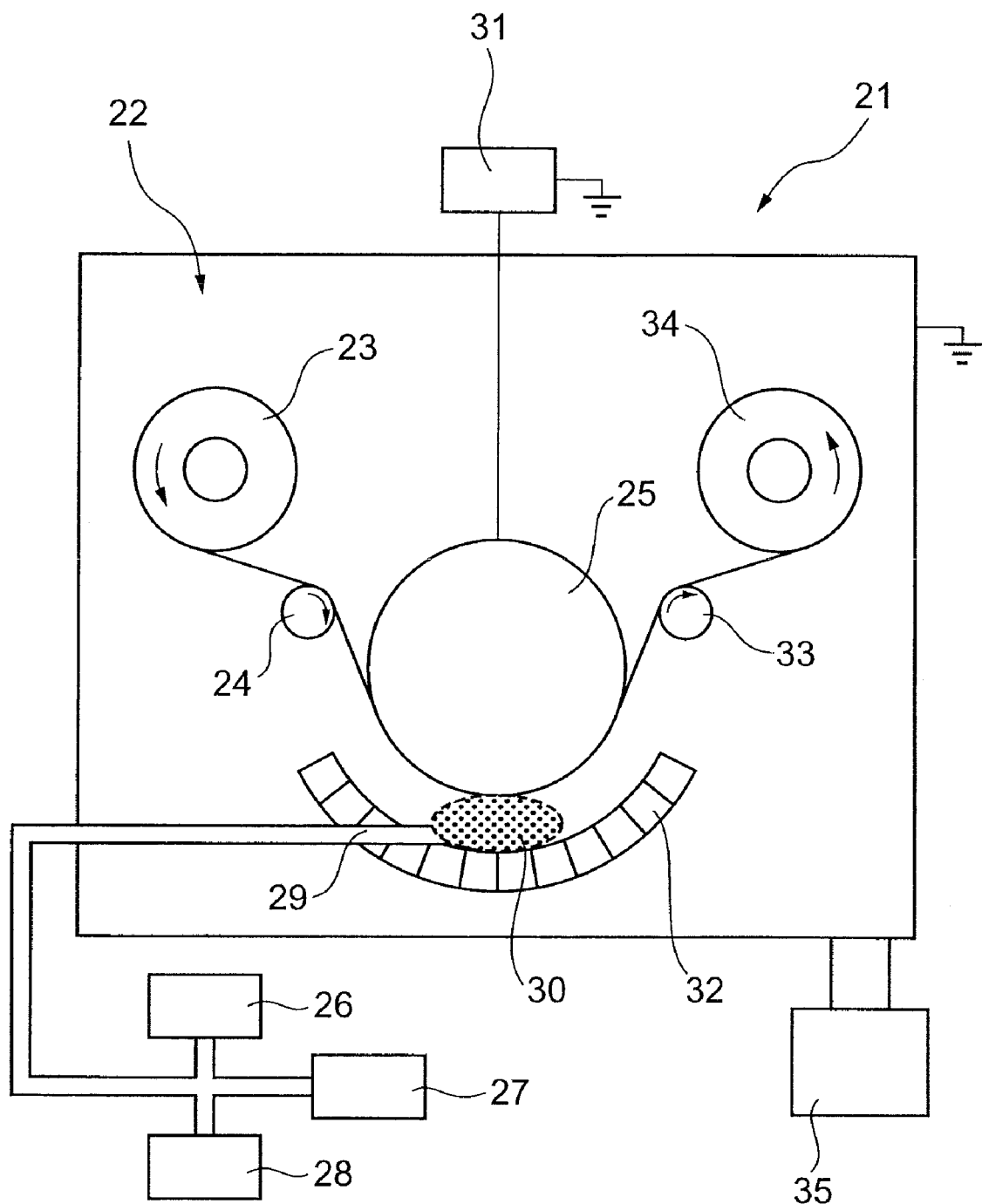
FIG. 3 is a schematic view of a chemical vapor deposition apparatus for use in the process according to the present invention.

Specifically, one embodiment of a method for the formation of a vapor deposited film of an inorganic oxide by the plasma chemical vapor deposition method will be described. FIG. 3 is a schematic diagram showing the construction of a low-temperature plasma chemical vapor deposition apparatus for briefly illustrating a method for forming a vapor deposited film of an inorganic oxide by the plasma chemical vapor deposition method.

As shown in FIG. 3, in the present invention, a resin film or sheet is unwound from an unwinding roll 23 disposed within a vacuum chamber 22 in a plasma chemical vapor deposition apparatus 21, and the unwound resin film or sheet is transferred at a predetermined speed through an auxiliary roll 24 and is transferred onto the circumference of a cooling/electrode drum 25.

In the present invention, an oxygen gas, an inert gas, a monomer gas for vapor deposition such as an organosilicon compound and the like are fed from gas feeding devices 26, 27 and a starting material volatilization feeding device 28, and the mixed gas composition for vapor deposition is introduced into a vacuum chamber 22 through a starting material feeding nozzle 29 while preparing the mixed gas composition for vapor deposition. Plasma is generated by glow discharge and applied onto the resin film or sheet transferred onto the circumference of the cooling/electrode drum 25 to form a vapor deposited film of an inorganic oxide such as silicon oxide.

In this case, in the present invention, a predetermined electric power is applied from a power supply 31 disposed outside the chamber to the cooling/electrode drum 25. Further, a magnet 32 is disposed near the cooling/electrode drum 25 to accelerate plasma generation. Next, the resin film or sheet with a vapor deposited film of an inorganic oxide such as silicon oxide formed thereon is wound around a winding roll 34 through a guide roll 33 to produce a resin film or sheet with a vapor deposited film of an inorganic oxide.

The above embodiment is merely an example of the formation of a vapor deposited film by the plasma chemical vapor deposition method, and the present invention is not limited to this embodiment.

In the present invention, the vapor deposited film of an inorganic oxide may have a single layer structure of one layer formed of a vapor deposited film of an inorganic oxide, or alternatively may have a multilayer structure of two or more stacked layers (not shown). In this case, one type or a mixture of two or more types of materials may be used. Further, a vapor deposited film of an inorganic oxide which is a mixture of materials different from each other in quality may be adopted.

In the above embodiment, preferably, the inside of the vacuum chamber is evacuated by a vacuum pump to regulate the degree of vacuum to about $1\times10^{-1}$ to $1\times10^{-8}$ Torr, preferably about $1\times10^{-3}$ to $1\times10^{-7}$ Torr.

In the starting material volatilization feeding device, the organosilicon compound as the starting material is volatilized and is mixed with an oxygen gas, an inert gas and the like fed from the gas feeding device, and the mixed gas is introduced into the vacuum chamber through the starting material feeding nozzle.

In this case, in the mixed gas, the content of the organosilicon compound may be about 1 to 40%, the content of the oxygen gas may be about 10 to 70%, and the content of the inert gas may be about 10 to 60%. The mixing ratio of the oganosilicon compound to the oxygen gas to the inert gas may be, for example, about 1:6:5 to 1:17:14.

On the other hand, since a predetermined voltage is applied from the electrode to the cooling/electrode drum, glow discharge plasma is generated in a part near the opening in the starting material feed nozzle and the cooling/electrode drum within the vacuum chamber. This glow discharge plasma is led out from one or more gas components in the mixed gas. In this state, the resin film or sheet is transferred at a given speed, whereby a vapor deposited film of an inorganic oxide such as silicon oxide can be formed by the glow discharge plasma on the resin film or sheet on the circumference of the cooling/electrode drum.

In this case, the degree of vacuum within the vacuum chamber is preferably regulated to about $1\times10^{-1}$ to $1\times10^{-4}$ Torr, preferably about $1\times10^{-1}$ to $1\times10^{-2}$ Torr. Further, the transfer speed of the resin film is preferably regulated to about 10 to 300 m/min, preferably about 50 to 150 m/min.

Further, in the plasma chemical vapor deposition apparatus, while the plasmatized starting material gas is oxidized with the oxygen gas, the vapor deposited film of an inorganic oxide such as silicon oxide is formed, on the resin film or sheet, as a thin film of $SiO_x$. Accordingly, the vapor deposited film of an inorganic oxide such as silicon oxide thus formed is a continuous layer that is dense, has no significant voids, and is highly flexible, and the level of gas barrier properties of the vapor deposited film of an inorganic oxide such as silicon oxide is much higher than the level of gas barrier properties of the vapor deposited film of an inorganic oxide such as silicon oxide formed, for example, by the conventional vacuum vapor deposition method. Thus, a satisfactory level of gas barrier properties can be realized in a small film thickness.

Further, in the present invention, the surface of the resin film or sheet is cleaned by the $SiO_x$ plasma to generate polar groups, free radicals and the like on the surface of the resin film or sheet. Therefore, the adhesion between the formed vapor deposited film of an inorganic oxide such as silicon oxide and the resin film or sheet is advantageously high.

Further, in the formation of the continuous film of an inorganic oxide such as silicon oxide, the degree of vacuum is regulated to about $1 \times 10^{-1}$ to $1 \times 10^{-4}$ Torr, preferably, about $1 \times 10^{-1}$ to $1 \times 10^{-2}$ Torr. Since this degree of vacuum is lower than the degree of vacuum (about $10^{-4}$ to $10^{-5}$ Torr) in the formation of a vapor deposited film by the conventional vacuum vapor deposition method, the necessary vacuum state setting time in the resin film or sheet roll replacement can be shortened. Thus, the degree of vacuum is stable, and the film formation process can be stabilized.

In the present invention, the vapor deposited film of silicon oxide formed by using a monomer gas for vapor deposition such as an organosilicon compound is a thin film having good denseness, flexibility and other properties formed by chemically reacting the monomer gas for vapor deposition such as an organosilicon compound, for example, with an oxygen gas and intimately adhering the reaction product to one side of the resin film or sheet and is generally a continuous thin film composed mainly of silicon oxide represented by general formula: $SiO_x$ wherein X is a number of 0 to 2.

From the viewpoints of transparency, barrier properties and the like, the vapor deposited film of silicon oxide is preferably a thin film composed mainly of a vapor deposited film of silicon oxide represented by general formula: $SiO_x$ wherein X is a number of 1.3 to 1.9.

In this case, the value of X varies depending, for example, upon the molar ratio of the monomer gas for vapor deposition to the oxygen gas and plasma energy. In general, the gas permeability decreases with reducing the value of X. In this case, however, the film per se is yellowed, and the transparency is deteriorated.

Further, preferably, the vapor deposited film of silicon oxide is composed mainly of silicon oxide and further contains, for example, through a chemical bond, at least one compound comprising one element or two or more elements of carbon, hydrogen, silicon and oxygen. For example, in some cases, C—H bond-containing compounds, Si—H bond-containing compounds, or, when the carbon unit is, for example, in the form of graphite, diamond, or fullerene, the starting organosilicon compound or derivatives thereof may be contained, for example, through a chemical bond.

Specific examples thereof include $CH_3$ site-containing hydrocarbons, hydrosilicas such as $SiH_3$ silyl and $SiH_2$ silylene, and hydroxyl group derivatives such as $SiH_2OH$ silanol.

Also in cases other than described above, for example, the type and amount of the compound contained in the vapor deposited film of silicon oxide may be varied by varying conditions for the vapor deposition process and the like.

The content of the above compound in the vapor deposited film of silicone oxide is about 0.1 to 50%, preferably about 5 to 20%.

In this case, when the content of the compound is less than 0.1%, the impact resistance, malleability, flexibility and the like of the vapor deposited film of silicon oxide are unsatisfactory. Accordingly, for example, upon bending, scratches, cracks and the like are likely to occur, and it is difficult to stably maintain a high level of barrier properties. On the other hand, when the content of the compound is more than 50%, the level of gas barrier properties is disadvantageously lowered.

Further, in the present invention, in the vapor deposited film of silicon oxide, preferably, the content of the compound is reduced from the surface of the vapor deposited film of silicon oxide in the depth direction. According to this construction, in the surface of the vapor deposited film of silicon oxide, the impact resistance and the like are improved by the above compound and the like. On the other hand, at the interface of the base material and the vapor deposited film, the content of the compound is low, and, thus, the adhesion between the base material and the vapor deposited film of silicon oxide is strong.

In the present invention, for the vapor deposited film of silicon oxide, the above properties may be confirmed by an elementary analysis of the vapor deposited film of silicon oxide utilizing a method, for example, in which a surface analyzer such as X-ray photoelectron spectroscopy (XPS) or secondary ion mass spectroscopy (SIMS) is used and ion etching is carried out in the depth direction.

Further, in the present invention, the thickness of the vapor deposited film of silicon oxide is preferably about 50 to 4000 angstroms, more specifically about 100 to 1000 angstroms. When the thickness of the vapor deposited film is more than 1000 angstroms and even more than 4000 angstroms, disadvantageously, unfavorable phenomena such as cracking is likely to occur in the film. On the other hand, when the thickness of the vapor deposited film is less than 100 angstroms and even less than 50 angstroms, the gas barrier effect cannot be expected.

The thickness of the vapor deposited film may be measured, for example, by a fundamental parameter method using an X-ray fluorescence spectroscopic device (model: RIX 2000) manufactured by Rigaku Corporation.

The thickness of the vapor deposited film of silicon oxide may be varied, for example, by a method in which the deposition speed of the vapor deposited film is increased, that is the amounts of the monomer gas and the oxygen gas are increased, or by a method in which the deposition speed is decreased.

In the present invention, examples of monomer gases for vapor deposition such as organosilicon compounds for the formation of the vapor deposited film of an inorganic oxide such as silicon oxide include 1,1,3,3-tetramethyldisiloxane, hexamethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane.

In the present invention, among the above organosilicon compounds, 1,1,3,3-tetramethyldisiloxane or hexamethyldisiloxane is particularly preferred as the starting material, for example, from the viewpoints of handleability and properties of the formed continuous film.

Examples of inert gases usable herein include argon gas and helium gas.

In the present invention, in the formation of the vapor deposited film by the chemical vapor deposition, the formation of two or more silicon oxide layers as the vapor deposited film is preferred. The provision of the vapor deposited film having a multilayer structure can realize further improved gas barrier properties.

A method by which a vapor deposited film having a multilayer structure is formed by a plasma chemical vapor deposition method will be described.

Figure 4:
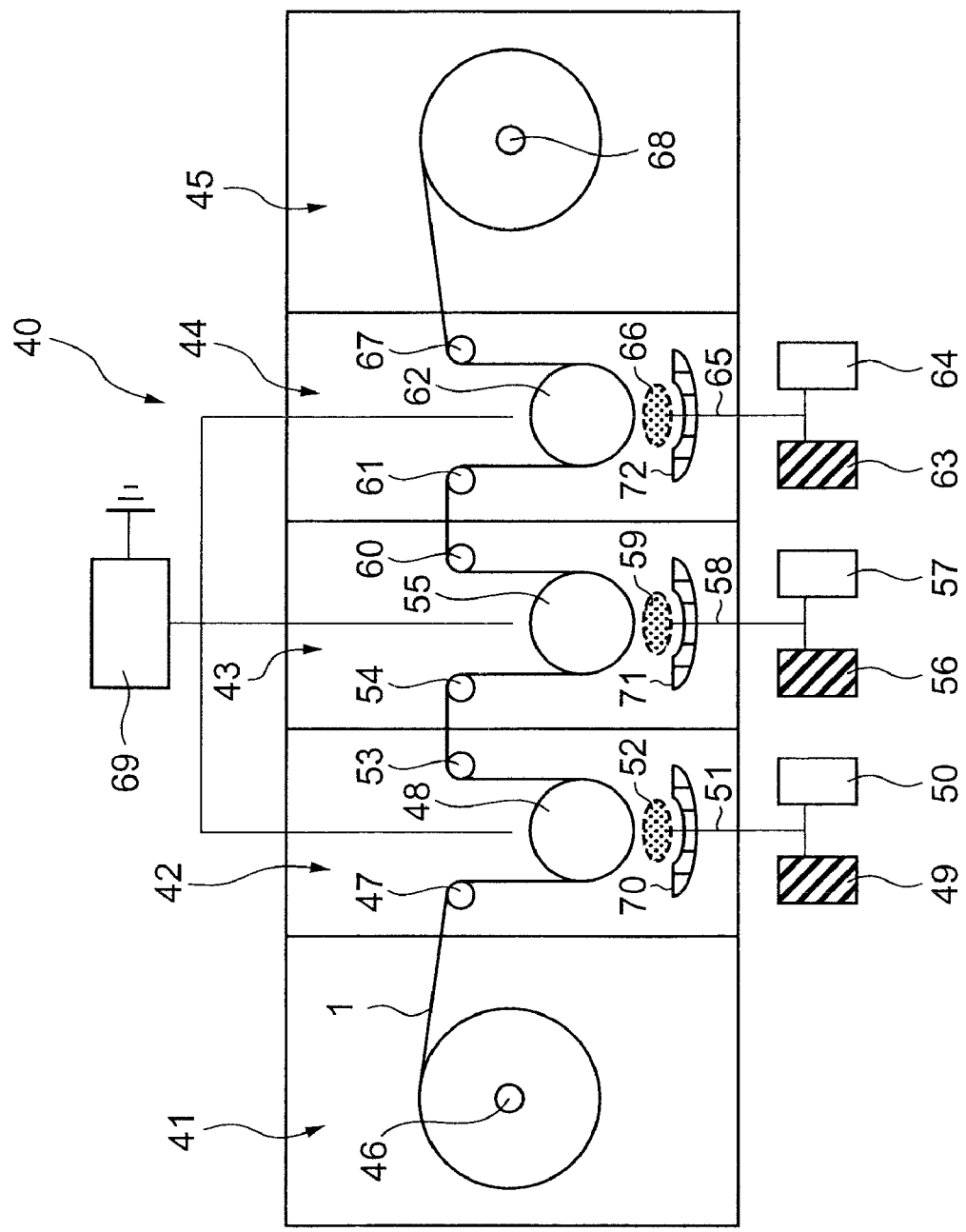
FIG. 4 is a schematic view of a chemical vapor deposition apparatus for use in another embodiment of the process according to the present invention.

As shown in FIG. 4, a plasma chemical vapor deposition apparatus 40 basically comprises a base material film feeding chamber 41, a first film forming chamber 42, a second film forming chamber 43, a third film forming chamber 44, and a winding chamber 45 for winding a film formed by forming and superimposing a film of a silicon oxide layer on the base material film.

At the outset, a base material film 1 wound around an unwinding roll 46 is unwound and placed in the first film forming chamber 42 and is further transferred at a predetermined speed through an auxiliary roll 47 on the circumference of a cooling/electrode drum 48.

Next, a monomer gas for film formation comprising at least one organosilicon compound, an oxygen gas, an inert gas and other materials are fed from a starting material volatilization feeding apparatus 49 and a gas feeding apparatus 50, and, while preparing a mixed gas composition for film formation comprising these materials, the mixed gas composition for film formation is introduced into the first film forming chamber 42 through a starting material feeding nozzle 51. Glow discharge plasma 52 is generated and applied onto the base material film 1 transferred on the circumference of the cooling/electrode drum 48 to form a first silicon oxide layer formed of silicon oxide and the like.

Next, the base material film on which the first silicon oxide layer has been formed in the first film forming chamber 42 is transferred into the second film forming chamber 43 through auxiliary rolls 53,54. Next, in the same manner as described above, the base material film on which the first silicon oxide layer has been formed is transferred onto the circumference of the cooling/electrode drum 55 at a predetermined speed.

Thereafter, in the same manner as described above, a monomer gas for film formation comprising at least one organosilicon compound, an oxygen gas, an inert gas and other materials are fed from a starting material volatilization feeding apparatus 56 and a gas feeding apparatus 57, and, while preparing a mixed gas composition for film formation comprising these materials, the mixed gas composition for film formation is introduced into the second film forming chamber 43 through a starting material feeding nozzle 58. Glow discharge plasma 59 is generated and applied onto the first silicon oxide layer provided on the base material film transferred onto the circumference of the cooling/electrode drum 55 to form a second silicon oxide layer formed of silicon oxide and the like on the first silicon oxide layer.

Further, in the same manner as described above, the base material film on which the first silicon oxide layer and the second silicon oxide layer have been formed in the first and second film forming chambers, respectively, is transferred into the third film forming chamber 44 through auxiliary rolls 60,61. Next, in the same manner as described above, the base material film on which the first and second silicon oxide layers have been formed is transferred onto the circumference of the cooling/electrode drum 62 at a predetermined speed.

Thereafter, in the same manner as described above, a monomer gas for film formation comprising at least one organosilicon compound, an oxygen gas, an inert gas and other materials are fed from a starting material volatilization feeding apparatus 63 and a gas feeding apparatus 64, and, while preparing a mixed gas composition for film formation comprising these materials, the mixed gas composition for film formation is introduced into the third film forming chamber 44 through a starting material feeding nozzle 65. Glow discharge plasma 66 is generated and applied onto the second silicon oxide layer provided on the second silicon oxide layer provided on the base material film transferred onto the circumference of the cooling/electrode drum to form a third silicon oxide layer formed of silicon oxide and the like.

Next, the base material film on which the first, second and third silicon oxide layers have been formed and superimposed in that order was transferred into a winding chamber 45 through an auxiliary roll 67 and was wound around a winding roll 68 to produce a gas barrier laminated film comprising a vapor deposited layer having a three layer structure of the first, second and third silicon oxide layers superimposed on top of each other.

In the present invention, the cooling/electrode drums (48, 55, 62) disposed respectively in the first, second and third film forming chambers (42, 43, 44) are supplied with a predetermined electric power from a power supply 69 disposed outside the first, second and third film forming chambers, and magnets (70, 71, 72) are disposed near the cooling/electrode drums (48, 55, 62) to accelerate the generation of plasma.

The plasma chemical vapor deposition apparatus is provided with a vacuum pump and the like (not shown), and the film forming chambers and the like are constructed to hold the vacuum state.

The above embodiment is mere one example of the present invention and should not be construed as limiting the present invention. In the above embodiment, the gas barrier laminated film comprises first, second and third silicon oxide layers superimposed on top of one another. In this connection, however, it should be noted that the film forming chambers may be regulated so that, for example, two or at least four silicon oxide layers are formed and superimposed on top of each other or one another. That is, the present invention is not limited to the production of the gas barrier laminated film comprising first, second and third silicon oxide layers superimposed on top of one another.

In the above embodiment, preferably, the inside of each of the film forming chambers is evacuated by a vacuum pump or the like to regulate the degree of vacuum to about $1\times10^{-1}$ to $1\times10^{-8}$ Torr, preferably about $1\times10^{-3}$ to $1\times10^{-7}$ Torr.

On the other hand, since a predetermined voltage is applied from the power supply to the cooling/electrode drum, in each film forming chamber, glow discharge plasma is generated in a part near the opening in the starting material feed nozzle and the cooling/electrode drum. This glow discharge plasma is led out from one or more gas components in the mixed gas composition for film formation. In this state, the base material film is transferred at a given speed, whereby a silicon oxide layer formed of silicon oxide and the like can be formed by glow discharge plasma on the base material film on the circumference of the cooling/electrode drum.

In this case, the degree of vacuum within each of the film forming chamber is preferably regulated to about $1\times10^{-1}$ to $1\times10^{-4}$ Torr, preferably about $1\times10^{-1}$ to $1\times10^{-2}$ Torr. Further, the transfer speed of the base material film is preferably regulated to about 10 to 300 m/min, preferably about 50 to 150 m/min.

In the present invention, the degrees of vacuum in the film forming chambers may be the same or different.

In the starting material volatilization feeding device, preferably, the monomer gas for film formation comprising one or more organosilicon compounds as the starting material is volatilized and is mixed with an oxygen gas, an inert gas and the like fed from the gas feeding device, and, while preparing a mixed gas composition for film formation comprising these gases, the mixed gas composition for film formation is introduced into each film forming chamber through the starting material feeding nozzle.

In this case, preferably, the gas mixing ratio of the gas components in the mixed gas composition for film formation is about 1 to 40% for the content of the monomer gas for film formation comprising one organosilicon compound, about 0 to 70% for the content of the oxygen gas, and about 1 to 60% for the content of the inert gas.

In the present invention, preferably, mixed gas compositions for film formation to be introduced into respective film forming chambers, which are different from each other in the gas mixing ratio of the gas components in the mixed gas composition for film formation are prepared and used for film formation in the respective film forming chambers to form silicon oxide layers formed of silicon oxide and the like superimposed on top of each other or one another.

More specifically, in the present invention, a method may be adopted in which mixed gas compositions for film formation each comprising a monomer gas for film formation comprising one or more organosilicon compounds, an oxygen gas and an inert gas but different from each other in the mixing ratio of the components in the mixed gas composition are prepared for respective film forming chambers, and the mixed gas compositions different from each other for the respective film forming chambers are used for silicon oxide layers formation by plasma chemical vapor deposition to form two or more silicon oxide layers superimposed on top of each other or one another.

In the present invention, regarding the mixing ratio of the gas components in the mixed gas composition for film formation, for example, a mixed gas composition for film formation having a gas composition ratio of monomer gas for film formation: oxygen gas:inert gas=1:0 to 5:1 (unit: slm, an abbreviation to standard liter minute) may be used as a first mixed gas composition for film formation, and a mixed gas composition for film formation having a gas composition ratio of monomer gas for film formation: oxygen gas:inert gas=1:6 to 15:1 (unit: slm) may be used as a second mixed gas composition for film formation.

In the present invention, the above mixed gas compositions for film formation may be used in any combination for use of mixed gas compositions for film formation different from each other in the mixing ratio of the gas components respectively in the first, second and third film forming chambers to form a plurality of films.

Formation of Vapor Deposited Film by Physical Vapor Deposition

In the present invention, the vapor deposited film of an inorganic oxide may be formed, for example, by physical vapor deposition methods (PVD methods) such as vacuum vapor deposition, sputtering, ion plating and ion cluster beam methods.

Specifically, a noncrystalline thin film of the inorganic oxide may be formed, for example, by a vacuum vapor deposition method in which a metal oxide is provided as a starting material which is then heated and vapor deposited on a resin film or sheet, or by an oxidation reaction vapor deposition method in which a metal or a metal oxide is provided as a starting material and oxygen is introduced for oxidation followed by the vapor deposition of the oxidation product on a resin film or sheet, or by a plasma acceleration-type oxidation reaction vapor deposition method in which the oxidation reaction is accelerated by plasma.

In the above embodiment, the vapor deposition material may be heated, for example, by electric resistance heating, high frequency induction heating, or electron beam heating (EB).

A vapor deposited film of a metal oxide may be mentioned as the vapor deposited film of an inorganic oxide. Specifically, for example, vapor deposited films of oxides of metals such as silicon (Si), aluminum (Al), magnesium (Mg), calcium (Ca), potassium (K), tin (Sn), sodium (Na), boron (B), titanium (Ti), lead (Pb), zirconium (Zr), and yttrium (Y) may be used. Preferred metals include silicon (Si) and aluminum (Al).

Metal oxides constituting the vapor deposited film include silicon oxide, aluminum oxide, and magnesium oxide which may be represented by $MO_x$, wherein M represents a metal element and the value of x may vary depending upon the metal element, such as $SiO_x$, $AlO_x$, or $MgO_x$.

The value of x may be 0 to 2 for silicon (Si), 0 to 1.5 for aluminum (Al), 0 to 1 for magnesium (Mg), 0 to 1 for calcium (Ca), 0 to 0.5 for potassium (K), 0 to 2 for tin (Sn), 0 to 0.5 for sodium (Na), 0 to 1.5 for boron (B), 0 to 2 for titanium (Ti), 0 to 1 for lead (Pb), 0 to 2 for zirconium (Zr), and 0 to 1.5 for yttrium (Y).

In the above embodiment, when x=0, the material is a completely metallic, that is, is not transparent and cannot be used at all. The upper limit of the value of x is a value in a completely oxidized state.

In the present invention, silicon (Si) and aluminum (Al) are generally used, and, in this case, the value of x is generally 1.0 to 2.0 for silicon (Si) and 0.5 to 1.5 for aluminum (Al).

In the present invention, the thickness of the vapor deposited film of an inorganic oxide may vary depending, for example, upon the type of the metal or metal oxide used and may be selected, for example, from about 50 to 4000 angstroms, preferably about 100 to 1000 angstroms.

Further, in the present invention, regarding the vapor deposited film of an inorganic oxide, one type or a mixture of two or more types may be used as the metal or metal oxide, and a vapor deposited film of an inorganic oxide of a mixture of different materials may also be formed.

Figure 5:
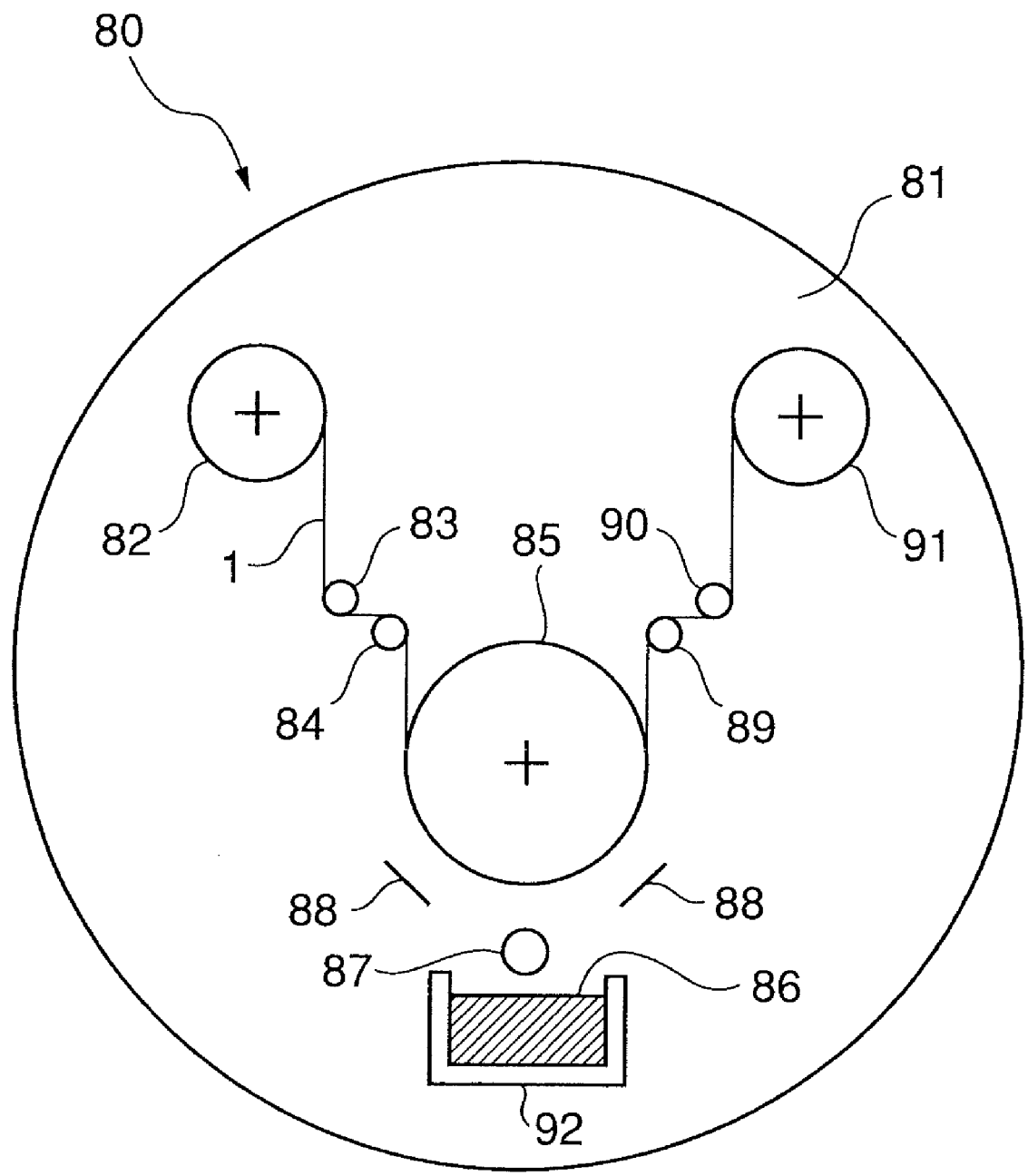
FIG. 5 is a schematic view of a physical vapor deposition apparatus for use in the process according to the present invention.

A method for forming the above vapor deposited film of an inorganic oxide according to the present invention will be described. FIG. 5 is a schematic construction diagram illustrating one embodiment of a winding-type vacuum vapor deposition apparatus.

As shown in FIG. 5, in a vacuum chamber 81 in a winding-type vacuum vapor deposition apparatus 80, a resin film or sheet 1 unwound from a unwinding roll 82 is guided to a cooled coating drum 85 through guide rolls 83, 84.

A vapor deposition source 86, for example, metallic aluminum or aluminum oxide, heated in a crucible 92 is evaporated on the resin film or sheet guided on the cooled coating drum. Further, if necessary, an oxygen gas and the like is ejected through an oxygen gas blowout port 87, and, while feeding the gas, for example, a vapor deposited film of an inorganic oxide such as aluminum oxide is formed on the resin film or sheet through a mask 88. Next, for example, the resin film or sheet with a vapor deposited film of an inorganic oxide such as aluminum oxide formed thereon may be wound around a winding roll 91 through guide rolls 89, 90 to produce a resin film or sheet with a vapor deposited film of an inorganic oxide such as aluminum oxide formed thereon.

The above embodiment is mere one example of the present invention and should not be construed as limiting the present invention.

In the present invention, a vapor deposited inorganic oxide film having a multilayer structure of two or more layers may be formed by providing the above-described winding-type vacuum vapor deposition apparatus, first forming a vapor deposited film of a first inorganic oxide layer and then likewise forming another vapor deposited film of an inorganic oxide on the vapor deposited film of the inorganic oxide, or by connecting two winding-type vacuum vapor deposition apparatuses as described above to each other in series and continuously forming vapor deposited inorganic oxide films.

Gas Barrier Coating Film

Next, the gas barrier coating film constituting the gas barrier laminated film according to the present invention will be described.

A gas barrier coating film formed by using a gas barrier composition produced by polycondensation, by a sol-gel process, of a composition containing at least one alkoxide represented by general formula: $R^1{}_nM(OR^2)_m$, polyvinyl alcohol and/or ethylene-vinyl alcohol may be used as the gas barrier coating film.

At least one partial hydrolysate or hydrolysis condensate of alkoxides represented by general formula: $R^1{}_nM(OR^2)_m$ wherein M represents a metal atom, $R^1$ and $R^2$ represent an organic group having 1 to 8 carbon atoms, n is 0 or more, m is an integer of 1 or more, n+m is the valence of M, is suitable for use in the present invention. In the partial hydrolysate of the alkoxide, there is no need that all the alkoxy groups have been hydrolyzed. Specifically, a partial hydrolysate in which one or more alkoxy groups have been hydrolyzed, or a mixture of hydrolyzed alkoxides having varied degree of hydrolysis may be used. The hydrolysis condensate is a dimer or higher multimer of a partially hydrolyzed alkoxide and is generally a di- to hexamer.

In the general formula: $R^1{}_nM(OR^2)_m$, the metal atom represented by M may be silicon, zirconium, titanium, aluminum or the like, preferably silicon. These metal alkoxides may be used solely or as a mixture of two or more in an identical solution.

Specific examples of organic group $R^1$ include alkyl groups such as methyl, ethyl, n-propyl, n-propyl, i-propyl, n-butyl, i-butyl, sec-butyl, t-butyl, n-hexyl, and n-octyl groups. Specific examples of organic group $R^2$ include methyl, ethyl, n-propyl, i-propyl, n-butyl, and sec-butyl groups. In the same molecule, these alkyl groups may be the same or different.

Among the alkoxides, alkoxysilanes in which M represent Si are preferred. The alkoxysilane is represented by $Si(OR^a)_4$ wherein R represents a lower alkyl group. Examples of Ra include methyl, ethyl, N-propyl, and N-butyl groups, and specific examples of alkoxysilanes include tetramethoxysilane $Si(OCH_3)_4$, tetraethoxysilane $Si(OC_2H_5)_4$, tetrapropoxysilane $Si(OC_3H_7)_4$, and tetra butoxysilane $Si(OC_4H_9)_4$.

Further, alkylalkoxysilanes represented by $R^b{}_mSi(OR^c)_{4-m}$ may be used. In the formula, m is an integer of 1, 2 or 3, and Rb and Rc represent methyl, ethyl or other group. Specific examples of alkylalkoxysilanes include methyltrimethoxysilane $CH_3Si(OCH_3)_3$, methyltriethoxysilane $CH_3Si(OC_2H_5)_3$, dimethyldimethoxysilane $(CH_3)_2Si(OCH_3)_2$, and dimethyldiethoxysilane $(CH_3)_2Si(OC_2H_5)_2$. These alkoxysilanes and alkylalkoxysilanes may be used either solely or as a mixture of two or more.

Further, a polycondensates of alkoxysilanes may be used. Specific examples thereof include polytetramethoxysilane and polytetraethoxysilane.

Specific examples of suitable zirconium alkoxides, wherein M represents Zr, among the alkoxides, include tetramethoxyzirconium $Zr(O-CH_3)_4$, tetraethoxyzirconium $Zr(O-C_2H_5)_4$, tetraipropoxyzirconium $Zr(O\text{-Iso-}C_3H_7)_4$, and tetranbutoxyzirconium $Zr(O-C_4H_9)_4$.

Specific examples of suitable titanium alkoxides, wherein M represents Ti, among the above alkoxides include tetramethoxytitanium $Ti(O-CH_3)_4$, tetraethoxytitanium $Ti(O-C_2H_5)_4$, tetraisopropoxytitanium $Ti(O\text{-Iso-}C_3H_7)_4$, and tetranbutoxytitanium $Ti(O-C_4H_9)_4$.

Specific examples of suitable aluminum alkoxides, wherein M represents Al, among the above alkoxides include tetramethoxyaluminum $Al(O-CH_3)_4$, tetraethoxyaluminum $Al(O-C_2H_5)_4$, tetraisopropoxyaluminum $Al(O\text{-Iso-}C_3H_7)_4$, and tetranbutoxyaluminum $Al(O-C_4H_9)_4$.

A mixture of two or more alkoxides as described above may also be used. In particular, the use of a mixture of the alkoxysilane with the zirconium alkoxide can improve the toughness, heat resistance and the like of the formed laminated film and can avoid a deterioration, for example, in the retort resistance of the film in the stretching. The amount of the zirconium alkoxide used is not more than 10 parts by weight, preferably about 5 parts by weight, based on 100 parts by weight of the alkoxysilane. When the amount of the zirconium alkoxide used is more than 10 parts by weight, the formed composite polymer is likely to gel. As a result, the fragility of the composite polymer is increased, and the composite polymer layer when covered on the base material film is likely to be separated.

In particular, the use of a mixture of the alkoxysilane with the titanium alkoxide can lower the thermal conductivity of the film and can significantly improve the heat resistance of the base material. The amount of the titanium alkoxide used is not more than 5 parts by weight, preferably about 3 parts by weight, based on 100 parts by weight of the alkoxysilane. When the amount of the titanium alkoxide used is more than 5 parts by weight, the fragility of the composite polymer is increased and the composite polymer layer when covered on the base material film is likely to be separated.

In the present invention, the combined use of the alkoxide and a silane coupling agent is preferred. Conventional organic reactive group-containing organoalkoxysilanes are usable as the silane coupling agent. Epoxy group-containing organoalkoxysilanes are particularly preferred. Examples thereof include γ-glycidoxypropyltrimethoxysilane, γ-glycidoxypropylmethyldiethoxysilane, and β-(3,4-epoxycyclohexyl)ethyltrimethoxysilane. These silane coupling agents may be used as a mixture of two or more. The amount of the silane coupling agent used is in the range of 0.1 to parts by weight based on 100 parts by weight of the alkoxysilane. When the amount of the silane coupling agent used is more than 20 parts by weight, the rigidity and fragility of the composite polymer are increased, resulting in deteriorated insulating properties and processability of the composite polymer layer.

In the present invention, the composition (coating liquid) for gas barrier coating film formation contains a polyvinyl alcohol and/or an ethylene-vinyl alcohol copolymer. When the composition (coating liquid) for gas barrier coating film formation is used in combination with the polyvinyl alcohol and the ethylene-vinyl alcohol copolymer, for example, the gas barrier properties, water resistance, and weathering resistance of the coating film are significantly improved. Further, the laminated film comprising a combination of the polyvinyl alcohol with the ethylene-vinyl alcohol copolymer is excellent in gas barrier properties, water resistance, and weathering resistance, as well as in hot water resistance and gas barrier properties after hot water treatment.

When a combination of the polyvinyl alcohol and the ethylene-vinyl alcohol copolymer is adopted, the content weight ratio thereof is preferably 10:0.05 to 10:6, more preferably about 10:1.

The total content of the polyvinyl alcohol and/or the ethylene-vinyl alcohol copolymer is 5 to 600 parts by weight, preferably about 50 to 400 parts by weight, based on 100 parts by weight of the total amount of the alkoxide. When the total content exceeds 600 parts by weight, the fragility of the composite polymer is increased and, at the same time, the water resistance and the weathering resistance of the formed laminated film are deteriorated. On the other hand, when the total content is less than 5 parts by weight, the gas barrier properties are deteriorated.

In the present invention, the above composition (coating liquid) is coated onto the vapor deposited film, and the coated composition is polycondensed by a sol-gel process to form a coating film. Tertiary amines substantially insoluble in water and soluble in organic solvents are used as a catalyst for the sol-gel process, mainly as a catalyst for the polycondensation.

Examples thereof include N,N-dimethylbenzylamine, tripropylamine, tributylamine, and tripentylamine. N,N-Dimethylbenzylamine is particularly preferred. The amount of the tertiary amine used is 0.01 to 1 parts by weight, preferably about 0.03 part by weight, based on 100 parts by weight in total of the alkoxide and silane coupling agent.

In the present invention, the composition may further comprise an acid. The acid is used as a catalyst for the sol-gel process, mainly as a catalyst for hydrolysis of the alkoxide, silane coupling agent and the like. Acids usable herein include mineral acids such as sulfuric acid, hydrochloric acid, and nitric acid, and organic acids such as acetic acid and tartaric acid. The amount of the acid used is 0.001 to 0.05 mole, preferably about 0.01 mole, based on the total molar amount of the alkoxide and the alkoxide content (for example, silicate moiety) of the silane coupling agent.

In the present invention, 0.1 to 100 moles, preferably 0.8 to 2 moles, based on one mole of the total molar amount of the alkoxide, of water is contained in the composition for gas barrier coating film formation. When the amount of water is more than 2 moles, the polymer produced from the alkoxysilane and the metal alkoxide is in the form of spherical particles. Further, in this case, the spherical particles are three-dimensionally crosslinked, and, thus, the produced polymer is a low-density porous polymer. The porous polymer cannot improve the gas barrier properties of the base material film. When the amount of water is less than 0.8 mole, the hydrolysis reaction is less likely to proceed.

Further, the composition for gas barrier coating film formation preferably contains an organic solvent. Organic solvents include methyl alcohol, ethyl alcohol, n-propyl alcohol, isopropyl alcohol, and n-butanol.

The polyvinyl alcohol and/or ethylene-vinyl alcohol copolymer are preferably in the form of a solution in the composition (coating liquid) containing the alkoxide, silane coupling agent and the like. To this end, the type of the organic solvent is properly selected. When a combination of the polyvinyl alcohol with the ethylene-vinyl alcohol copolymer is adopted, n-butanol is preferably used. The ethylene-vinyl alcohol copolymer solubilized in the solvent is, for example, commercially available as SoarnoL (tradename). The amount of the organic solvent used is generally 30 to 500 parts by weight based on 100 parts by weight in total of the alkoxide, silane coupling agent, polyvinyl alcohol and/or ethylene-vinyl alcohol copolymer, acid and catalyst for the sol-gel process.

In the gas barrier laminated film according to the present invention, a method for gas barrier coating film formation will be described.

At the outset, the alkoxysilane, silane coupling agent, vinyl alcohol polymer, catalyst for the sol-gel process, acid, water, organic solvent, and optionally metal alkoxide are mixed together to prepare a coating liquid. In the coating liquid, a polycondensation reaction proceeds gradually. Next, the coating liquid is coated by a conventional method onto the base material film, and the coating is dried. Drying allows the polycondensation of the alkoxysilane, metal alkoxide, silane coupling agent and vinyl alcohol polymer to further proceed, thereby forming a composite polymer layer. Preferably, the above procedure is repeated to stack a plurality of composite polymer layers. Finally, the film coated with the coating liquid is heated at a temperature of 150° C. to 250° C. for 30 sec to 10 min.

Thus, excellent oxygen barrier properties and water vapor barrier properties can be provided by coating the coating liquid composed mainly of the alkoxysilane, silane coupling agent, and vinyl alcohol polymer on the base material in its vapor deposited film side and heating the assembly at a temperature of 150° C. to 250° C. In the conventional gas barrier coating film composed mainly of a vinyl alcohol polymer, oxygen barrier properties are significantly deteriorated under a high temperature and humidity atmosphere (40° C., 90% RH). On the other hand, the gas barrier laminated film according to the present invention has excellent oxygen barrier properties even under a high temperature and humidity atmosphere. The gas barrier coating film composed mainly of a vinyl alcohol polymer per se does not have water vapor barrier properties. However, the coating of the coating liquid having the above composition onto the base material in its vapor deposited film surface side followed by heating of the assembly at a predetermined temperature according to the present invention can significantly improve the water vapor barrier properties. The reason for this is believed to be as follows but should not be construed as limiting the present invention. Specifically, it is considered that the excellent oxygen barrier properties and water vapor barrier properties can be realized by a crosslinking reaction within the coating film to cause hydrogen bond or chemical bond between the vinyl alcohol polymer and the hydrolysate of the alkoxysilane, crystallization of the vinyl alcohol polymer, and strong adhesion between the vapor deposited film and the gas barrier coating film at the interface of the vapor deposited film and the gas barrier coating film through the hydrogen bond or the chemical bond. Since the gas barrier coating film has a crosslinked structure formed, for example, by a hydrogen bond or a chemical bond, it is considered that the molecular motion of the polymer is constrained even when the assembly is allowed to stand under a high temperature and humidity atmosphere and, thus, a high level of gas barrier properties can be developed.

When the heating temperature is below 150° C., the oxygen barrier properties and water vapor barrier properties are not improved. On the other hand, when the heating temperature is above 250° C., damage to the base material and unfavorable phenomena such as cockling or curling occurs, resulting in deteriorated gas barrier properties. The heating temperature is preferably 180 to 200° C.

In the present invention, instead of the vinyl alcohol polymer, a composition using either ethylene-vinyl alcohol copolymer or both the ethylene-vinyl alcohol copolymer and the polyvinyl alcohol may be used. The laminated film using both the ethylene-vinyl alcohol copolymer and the polyvinyl alcohol can realize further improved gas barrier properties after hot water treatment such as boiling treatment or retort treatment.

Another preferred embodiment of the method for forming the gas barrier coating film, which can provide the following laminated film having improved gas barrier properties after hot water treatment, will be described.

Specifically, a polyvinyl alcohol-containing composition is previously coated onto at least one side of the base material film to form a first composite polymer layer, and the ethylene-vinyl alcohol copolymer-containing composition is coated onto the coating to form a second composite polymer layer. Thus, the gas barrier properties of the laminated film thus formed can be improved.

Further, in the present invention, a gas barrier coating film having a multilayer structure may be formed on the base material film. The provision of the gas barrier coating film having a multilayer structure can realize further improved gas barrier properties.

The function of the gas barrier coating film will be described by taking the use of the alkoxysilane as an example. The alkoxysilane and the metal alkoxide are hydrolyzed by the added water. In this case, an acid functions as a catalyst for the hydrolysis. Proton is then captured from the produced hydroxyl group by the function of the catalyst for the sol-gel process, and dehydropolycondensation between hyrolysates takes place. In this case, the silane coupling agent is also hyrolyzed by the acid catalyst to convert the alkoxy group to a hydroxyl group. The ring opening of the epoxy group also takes place by the action of the base catalyst to produce a hydroxyl group. Further, polycondensation between the hydrolyzed silane coupling agent and the hydrolyzed alkoxide also proceeds. Furthermore, since polyvinyl alcohol, or ethylene-vinyl alcohol copolymer, or both polyvinyl alcohol and ethylene-vinyl alcohol are present in the reaction system, a reaction with hydroxyl groups contained in the polyvinyl alcohol and the ethylene-vinyl alcohol copolymer also takes place. The polycondensation product thus produced is a composite polymer comprising an inorganic moiety comprising a bond such as Si—O—Si, Si—O—Zr, or Si—O—Ti, and an organic moiety derived from the silane coupling agent. In the above reaction, for example, a straight chain polymer having a partial structure represented by the following formula:

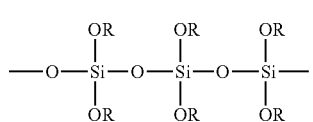
[Formula 1]

wherein R represents an alkyl group, and further having a moiety derived from the silane coupling agent is first produced.

In this polymer, group OR (alkoxy group such as ethoxy group) is present in a form branched from the straight chain polymer. This group OR is hydrolyzed, through the action of the acid which functions as a catalyst, to OH group. The OH group is first deprotonated by the function of the catalyst for the sol-gel process (base catalyst), and polycondensation then proceeds. Specifically, it is considered that this OH group is polycondensed with a polyvinyl alcohol represented by formula:

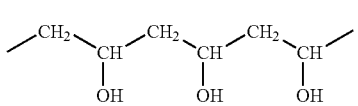
[Formula 2]

or an ethylene-vinyl alcohol copolymer represented by formula:

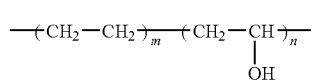
[Formula 3]

wherein m and n are an integer of 1 or more to give a composite polymer having an Si—O—Si bond represented, for example, by formula:

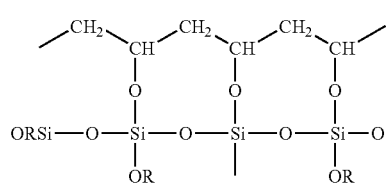
[Formula 4]

wherein R represents hydrogen or an alkyl group, or a copolymerized composite polymer represented by formula:

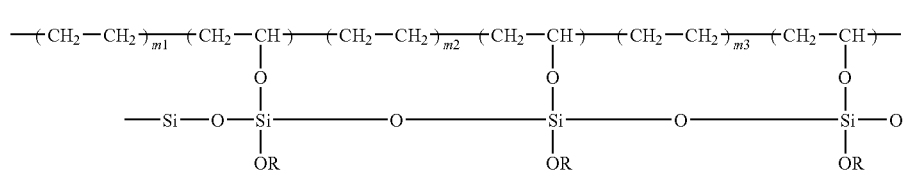
[Formula 5]

wherein m1, m2, and m3 represent an integer of 1 or more, and R represents an alkyl group, and formula:

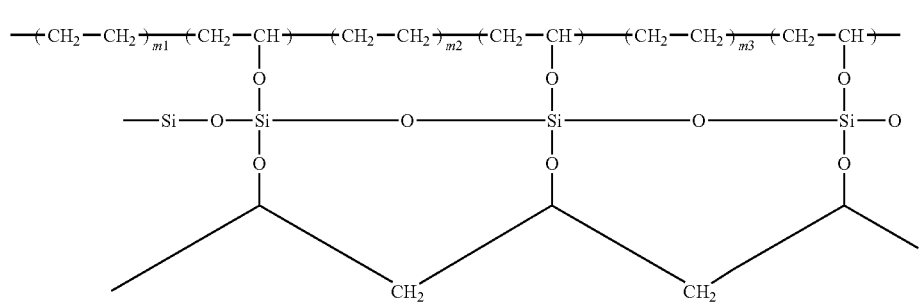
[Formula 6]

wherein m1, m2, and m3 are an integer of 1 or more, and R represents an alkyl group.

The above reaction proceeds at room temperature, and the viscosity of the coating liquid increases during the preparation of the coating liquid. The coating liquid is coated onto the base material film, and the coating is heated to remove the solvent and alcohol produced by polycondensation. This procedure completes the polycondensation reaction to form a transparent composite polymer layer on the base material film. When the composite polymer layer has a multilayer structure, condensation of composite polymers between the layers also takes place to form a strong bond between the layers. Further, since the organic reactive group in the silane coupling agent and the hydroxyl group produced by the hydrolysis are bonded to the hydroxyl group on the surface of the base material film, the adhesion between the base material film surface and the composite polymer layer is also good.

In the process according to the present invention, since the amount of water added is regulated to 0.8 to 2 moles, preferably 1.5 moles, based on one mole of the alkoxides, the straight chain polymer is formed. The straight chain polymer is crystalline and has a structure in which a number of fine crystals are occluded in a noncrystalline part. This crystal structure is the same as that of a crystalline organic polymer (for example, vinylidene chloride or polyvinyl alcohol). Further, the straight chain polymer contains a polar group (OH group) partially present within the molecule, has high molecular cohesive energy, has high molecular chain rigidity and thus can provide good gas barrier properties.

In the present invention, the vapor deposited film of an inorganic oxide and the gas barrier coating film form, for example, a chemical bond, a hydrogen bond, or a coordination bond by the hydrolysis or co-condensation to improve the adhesion between the vapor deposited film of an inorganic oxide and the gas barrier coating film, and the synergistic effect of the two layers can offer better gas barrier effect.

Methods usable for coating of the composition for gas barrier coating film formation include, for example, roll coating such as gravure coating, spray coating, spin coating, dip coating, brush coating, bar coating, coating with an applicator or the like. The coating is carried out once or is repeated a plurality of times to form a gas barrier coating film according to the present invention having a thickness of 0.01 µm to 30 µm, preferably 0.1 µm to 10 µm, on a dry basis.

The coating may be heat dried under a conventional environment at a temperature of 150 to 250° C., preferably 180 to 200° C., for 0.005 to 60 min, preferably 0.01 to 10 min, to cause condensation and thus to form the gas barrier coating film.

If necessary, in coating the gas barrier composition according to the present invention, for example, a primer agent may be previously coated on the vapor deposited film of an inorganic oxide.

In an embodiment of the present invention, a method may be adopted which comprises, after the provision of the vapor deposited layer and the gas barrier coating film on the base material, further providing a vapor deposited layer and forming a gas barrier coating film on the vapor deposited layer in the same manner as described above. Increasing the number of times of stacking can realize a laminated film having better gas barrier properties.

The gas barrier laminated film according to the present invention has the above excellent properties and thus is useful as packaging materials. In particular, the gas barrier laminated film according to the present invention has excellent gas barrier properties, for example, against $O_2$, $N_2$, $H_2O$, $CO_2$ and the like and thus is suitable for use as films for food packaging. When the gas barrier laminated film according to the present invention is used for the so-called gas packed packaging in which, for example, $N_2$ or $CO_2$ gas is packed, the excellent gas barrier properties are very useful for holding the packed gas.

The gas barrier laminated film according to the present invention also has excellent gas barrier properties after hot water treatment, particularly high-pressure hot water treatment (retort treatment).

Laminated Material for Packaging

Next, a packaging bag using the gas barrier laminated film according to the present invention will be described by taking a laminated material for packaging, comprising a gas barrier laminated film, a print layer, a laminated adhesive layer, and a heat seal layer provided in that order as an example.

Print Layer

A print layer may be formed as follows. An ink composition is prepared by providing one or at least two conventional ink vehicles as a main component, adding one or at least two optional additives such as plasticizers, stabilizers, antioxidants, photostabilizers, ultraviolet absorbers, curing agents, crosslinking agents, lubricants, antistatic agents, fillers, and other additives, further adding colorants such as dyes/pigments, and kneading the mixture with a solvent, a diluent or the like thoroughly. A desired print pattern of a character, a figure, a symbol, a design or the like may be then printed using the ink composition on the primer layer, for example, by a printing method such as gravure printing, offset printing, relief printing, screen printing, transfer printing, or flexographic printing to form a print pattern layer.

In the above embodiment, the ink vehicle may be one or at least two conventional materials selected, for example, from linseed oils, tung oils, soybean oils, hydrocarbon oils, rosins, rosin esters, rosin-modified resins, shellacs, alkyd resins, phenolic resins, maleic acid resins, naturally occurring resins, hydrocarbon resins, polyvinyl chloride resins, polyvinyl acetate resins, polystyrene resins, polyvinylbutyral resins, acrylic or methacrylic resins, polyamide resins, polyester resins, polyurethane resins, epoxy resins, urea resins, melamine resins, aminoalkyd resins, nitrocellulose, ethylcellulose, chlorinated rubber, cyclized rubber, and the like.

Laminated Adhesive Layer

Next, the adhesive layer for lamination constituting the laminated material will be described. Adhesives usable for constituting the adhesive layer for lamination include, for example, polyvinyl acetate adhesives, polyacrylic ester adhesives formed of homopolymers such as ethyl acrylate, butyl acrylate, or 2-ethylhexyl ester, or copolymers of ethyl acrylate, butyl acrylate, or 2-ethylhexyl ester, for example, with methyl methacrylate, acrylonitrile, or styrene, cyanoacrylate adhesives, ethylene copolymer adhesives formed of copolymers of ethylene with a monomer such as vinyl acetate, ethyl acrylate, acrylic acid, or methacrylic acid, cellulosic adhesives, polyester adhesives, polyamide adhesives, polyimide adhesives, amino resin adhesives formed of urea resins, melamine resins and the like, phenolic resin adhesives, epoxy adhesives, polyurethane adhesives, reactive (meth)acrylic adhesives, rubber adhesives formed of, for example, chloroprene rubbers, nitrile rubbers, or styrene-butadiene rubbers, silicone adhesives, and inorganic adhesives formed of alkali metal silicates, low-melting point glass and the like.

The composition constituting the above adhesives may be of any of aqueous type, solution type, emulsion type, and dispersion type and the like and may be in a film/sheet, powder, solid or other form. The bonding mechanism of the adhesives may be of any of chemical reaction type, solvent volatilization type, hot melt type, and thermocompression type and the like.

In the present invention, a method may be adopted which comprises applying the above adhesive on the whole area including the print layer, for example, by roll coating, gravure roll coating, or kiss coating, or by printing method, and then drying the coating to remove the solvent and the like to form an adhesive layer for lamination. The coverage of the adhesive layer is preferably about 0.1 to 10 g/m$^2$ on a dry basis.

Heat Sealing Resin Layer

Next, the heat sealing resin layer will be described. Any heat sealing resin may be used for constituting the heat sealing resin layer so far as the resin is heat melted and mutual fusing can take place. For example, a film or sheet of at least one resin such as an acid modified polyolefin resin prepared by modifying a polyolefin resin, such as low density polyethylene, medium density polyethylene, high density polyethylene, straight chain (linear) low-density polyethylene, polypropylene, ethylene-vinyl acetate copolymer, ionomer resin, ethylene-ethyl acrylate copolymer, ethylene-acrylic acid copolymer, ethylene-methacrylic acid copolymer, ethylene-propylene copolymer, methylpentene polymer, polyethylene, or polypropylene, for example, with an unsaturated carboxylic acid such as acrylic acid, methacrylic acid, maleic anhydride, or fumaric acid may be used.

In the present invention, the above resin film or sheet is dry laminated onto the surface of the adhesive layer for lamination to form a heat sealing resin layer.

The above resin film or sheet may have a single layer structure or a multilayer structure, and the thickness of the resin film or sheet is about 5 μm to 300 μm, preferably, about 10 μm to 110 μm.

The thickness of the resin film or sheet is preferably relatively thick from the viewpoint of preventing the occurrence of scratches, cracks or the like in the vapor deposited film of an inorganic oxide constituting a resin film or sheet comprising a vapor deposited film of an inorganic oxide, for example, in making of a bag-shaped vessel body, specifically about 70 μm to 110 μm, preferably about 80 μm to 100 μm.

In the present invention, resin films or sheets formed of linear low-density polyethylene are particularly preferred. The linear low-density polyethylene is tacky and thus is advantageous in that the propagation of breaking is less likely to occur and the impact resistance can be improved. Further, since the inner layer is always in contact with the contents of the bag, a deterioration in environmental stress cracking resistance can be advantageously prevented.

Further, in the present invention, the linear low-density polyethylene may be blended with other resin. For example, blending of ethylene-butyne copolymer or the like can advantageously improve tearability and can contribute to open-easiness, although the heat resistance is somewhat deteriorated and seal stability is likely to be deteriorated under a high-temperature environment.

The linear low-density polyethylene may also be a film or sheet of an ethylene- -olefin copolymer produced by polymerization in the presence of a metallocene catalyst. The film or sheet of an ethylene- -olefin copolymer produced by polymerization in the presence of the metallocene catalyst may be, for example, a film or sheet of an ethylene- -olefin copolymer produced by polymerization in the presence of a catalyst of a combination of a metallocene complex with alumoxane such as a catalyst of a combination of zirconocene dichloride with methylalumoxane, that is, in the presence of a metallocene catalyst.

Current catalysts have nonuniform active sites and are called multisite catalysts, where the metallocene catalysts have uniform active points and are called single site catalysts.

Specifically, ethylene- -olefin copolymer films produced by polymerization in the presence of metallocene catalysts such as "KERNEL" (tradename; manufactured by Mitsubishi Chemical Corporation), "EVOLU" (tradename; manufactured by Mitsui Petrochemical Industries, Ltd.), "EXACT" (tradename; manufactured by EXXON CHEMICAL, USA), and "AFFINITY" and "ENGAGE" (tradename; manufactured by DOW CHEMICAL, USA) may be used.

The film or sheet constituting the heat sealing resin layer may have a single or multilayer structure, and the thickness of the film or sheet is about 5 μm to 300 μm, preferably, about 10 μm to 100 μm.

In the present invention, the use of the ethylene- -olefin copolymer film or sheet, produced by polymerization in the presence of a metallocene catalyst, as the heat sealing resin film is advantageous in that low-temperature heat sealing is also possible in bag making.

In the present invention, a resin film may be held between the adhesive layer for lamination and the heat sealing resin layer. The provision of the intermediate layer can improve strength, piercing resistance and the like. Resin films or sheets having excellent mechanical, physical, chemical and other strength and possessing excellent piercing resistance and the like and possessing excellent other properties such as excellent heat resistance, moisture resistance, pinhole resistance, transparency and the other may be used as the resin film.

Specific examples of such films or sheets include polyester resins, polyamide resins, polyaramid resins, polypropylene resins, polycarbonate resins, polyacetal resins, fluororesins and other tough resins.

In the present invention, the above resin film or sheet may be held between the adhesion layer for lamination and the heat sealing resin layer, for example, by dry lamination, for example, with the aid of the above-described adhesive for lamination.

The resin film or sheet may be any of unstretched films or monoaxially or biaxially stretched films and the like. In the present invention, a minimum necessary thickness for maintaining, for example, strength and piercing resistance suffices for the thickness of the resin film or sheet. When the thickness is excessively large, the cost is disadvantageously increased. On the other hand, when the thickness is excessively small, the strength, piercing resistance and other properties are disadvantageously deteriorated.

In the present invention, for the above reason, the thickness of the resin film or sheet is about 10 μm to 100 μm, preferably about 12 μm to 50 μm.

In general, packaging bags are placed under physically and chemically severe conditions. Accordingly, the laminated material constituting the packaging bags should satisfy strict packaging suitability requirements. That is, the laminated material should satisfy various requirements, for example, deformation preventive strength, drop impact strength, pinhole resistance, heat resistance, sealing performance, quality maintenance, workability, and hygienic qualities. To this end, in the present invention, in addition to the above materials, other materials satisfying the above various requirements can be arbitrarily used. Specific examples thereof include films or sheets of conventional resins, for example, low-density polyethylene, medium-density polyethylene, high-density polyethylene, linear low-density polyethylene, polypropylene, ethylene-propylene copolymers, ethylene-vinyl acetate copolymers, ionomer resins, ethylene-ethyl acrylate copolymers, ethylene-acrylic acid or methacrylic acid copolymers, methylpentene polymers, polybutene resins, polyvinyl chloride resins, polyvinyl acetate resins, polyvinylidene chloride resins, vinyl chloride-vinylidene chloride copolymers, poly(meth)acrylic resins, polyacrylonitrile resins, polystyrene resins, acrylonitrile-styrene copolymers (AS resins), acrylonitrile-butadiene-styrene copolymers (ABS resins), polyester resins, polyamide resins, polycarbonate resins, polyvinyl alcohol resins, saponification products of ethylene-vinyl acetate copolymers, fluororesins, diene resins, polyacetal resins, polyurethane resins, and nitrocellulose. These films or sheets may be properly selected and used. Further, for example, synthetic papers may also be used.

In the present invention, the above film or sheet may be any of unstretched, monoaxially or biaxially stretched or other films or sheets. The thickness of the film or sheet may be any desired value, for example, may be selected from the range of several μm to 300 μm.

Further, in the present invention, the film or sheet may be any of a extruded film, an inflation molded film, coating film and other forms.

In the present invention, as described above, a laminated material for a packaging bag can be produced by providing a vapor deposited film of an inorganic oxide on one side of a base material film, providing a gas barrier coating film on the vapor deposited film of an inorganic oxide to prepare a gas barrier laminate, then successively providing a primer layer, a print pattern layer, and an adhesive layer for lamination using the gas barrier laminate by various coating or printing methods or dry lamination or other methods, providing a heat sealing resin layer on the adhesive layer for lamination, and further stacking a strong resin film having excellent piercing strength between the adhesive layer for lamination and the heat sealing resin layer.

Packaging Bag

Packaging bags using the above laminated material will be described. The laminated material formed of the gas barrier laminated film is used in a bag-shaped vessel body formed of a packaging bag. A packaged body can be produced by folding the laminated material in half so that the heat sealing resin layer surfaces of the folded material are superimposed on top of each other so as to face each other, heat sealing the end part of the assembly to form a cylindrical packaging body, sealing the bottom of the packaging body, filling contents into the packaging body, and sealing the ceiling part.

Packaging bags in various forms may be made by folding the above laminated material or superimposing the above laminated materials on top of each other so that the inner layers face each other, and heat sealing the peripheral edges, for example, in a lateral seal form, a two-way seal form, a three-way seal form, a four-way seal form, an envelope sticking seal form, a butt seal form (a pillow seal form), a ribbed seal form, a flat bottom seal form, a square bottom seal form, gusset seal form or other heat seal form. Further, for example, a self-supportable packaging bag (a standing pouch) is also possible.

The heat sealing may be carried out by conventional methods, for example, bar sealing, rotary roll sealing, belt sealing, impulse sealing, high-frequency sealing, or ultrasonic sealing.

EXAMPLE

The following Examples further illustrate the present invention. It should be noted that the present invention is not limited to these Examples.

Example 1

(1) A 12 μm-thick biaxially stretched polyethylene terephthalate film was provided. This film was mounted on a delivery roll in a plasma chemical vapor deposition apparatus, and a 200 angstrom-thick vapor deposited film of silicon oxide was formed on the biaxially stretched polyethylene terephthalate film on its corona treated surface under the following conditions.

(Conditions for Vapor Deposition)

Vapor deposited surface; corona treated surface

Introduced gas; hexamethyldisiloxane:oxygen gas:helium=1.0:3.0:3.0 (unit: slm)

Degree of vacuum within vacuum chamber; 2 to $6 \times 10^{-6}$ mbar

Degree of vacuum within vapor deposition chamber; 2 to $5 \times 10^{-3}$ mbar

Power supply to cooling/electrode drum; 10 kW

Line speed; 100 m/min

Next, immediately after the formation of the 200 angstrom-thick vapor deposited film of silicon oxide, the vapor deposited film surface of silicon oxide was subjected to oxygen/argon mixed gas plasma treatment at a power of 9 kw using a mixed gas composed of oxygen gas and argon gas (oxygen gas:argon gas=7.0:2.5 (unit: slm)) at a mixed gas pressure of $6 \times 10^{-5}$ Torr with a glow discharge plasma generator to form a plasma treated surface having a surface tension which has been improved in surface tension by not less than 54 dynes/cm over the surface tension of the vapor deposited surface of silicon oxide.

(2) On the other hand, according to the formulation shown in Table 1 below, an EVOH solution having a composition (a) of EVOH dissolved in a mixed solvent composed of isopropyl alcohol and ion exchanged water was provided. A previously prepared hydrolysis liquid having a composition (b) of ethyl silicate 40, isopropyl alcohol, acetyl acetone aluminum, and ion exchanged water was added to and mixed with the EVOH solution. Further, a previously prepared mixed liquid having a composition (c) of an aqueous polyvinyl alcohol solution, acetic acid, isopropyl alcohol, and ion exchanged water was added to and mixed with the mixture to prepare a colorless transparent composition for barrier coating film formation.

TABLE 1

| | | (wt %) |
|---|---|---|
| a | EVOH (degree of ethylene copolymerization 29%) | 0.122 |
| | Isopropyl alcohol | 0.659 |
| | $H_2O$ | 0.439 |
| b | Ethyl silicate 40 (manufactured by Colcoat Co., Ltd.) | 9.146 |
| | Isopropyl alcohol | 8.780 |
| | Aluminum acetyl acetone | 0.018 |
| | $H_2O$ | 16.291 |
| c | Polyvinyl alcohol | 1.220 |
| | Isopropyl alcohol | 19.893 |
| | $H_2O$ | 43.329 |
| | Acetic acid | 0.103 |
| | Total | 100.000 (wt %) |

Next, the composition for gas barrier coating film formation prepared above was coated by gravure roll coating onto the plasma treated surface formed in the above step (1). After the coating, the assembly was passed through a drying oven of 200° C. at a speed of 300 m/min for heat treatment to form a gas barrier coating film having a thickness of 0.4 g/m² on a dry basis. Thus, a gas barrier laminated film was produced.

Example 2

(1) A 12 μm-thick biaxially stretched polyethylene terephthalate film was provided. This film was mounted on a delivery roll in a plasma chemical vapor deposition apparatus, and a 200 angstrom-thick vapor deposited film of silicon oxide was formed on the biaxially stretched polyethylene terephthalate film on its corona treated surface under the following conditions.

(Conditions for Vapor Deposition)
Vapor deposited surface; corona treated surface
Introduced gas; hexamethyldisiloxane:oxygen gas:helium=1.0:3.0:3.0 (unit: slm)
Degree of vacuum within vacuum chamber; 2 to $6 \times 10^{-6}$ mbar
Degree of vacuum within vapor deposition chamber; 2 to $5 \times 10^{-3}$ mbar
Power supply to cooling/electrode drum; 10 kW
Line speed; 100 m/min Next, immediately after the formation of the 200 angstrom-thick vapor deposited film of silicon oxide, the vapor deposited film surface of silicon oxide was subjected to oxygen/argon mixed gas plasma treatment at a power of 9 kw using a mixed gas composed of oxygen gas and argon gas (oxygen gas:argon gas=7.0:2.5 (unit: slm)) at a mixed gas pressure of $6 \times 10^{-5}$ Torr with a glow discharge plasma generator to form a plasma treated surface having a surface tension which has been improved in surface tension by not less than 54 dynes/cm over the surface tension of the vapor deposited film surface of silicon oxide.

(2) On the other hand, according to the formulation shown in Table 2 below, a mixed liquid having a composition (b) of polyvinyl alcohol, isopropyl alcohol and ion exchanged water was provided. A previously prepared hydrolysis liquid having a composition (a) of ethyl silicate, isopropyl alcohol, hydrochloric acid, ion exchanged water, and a silane coupling agent was added to and mixed with the mixed liquid to prepare a colorless transparent composition for barrier coating film formation.

TABLE 2

|   |   | (wt %) |
|---|---|---|
| a | Ethyl silicate (tetraethoxysilane) | 16.667 |
|   | Isopropyl alcohol | 3.900 |
|   | 2 N hydrochloric acid | 0.532 |
|   | $H_2O$ | 22.567 |
|   | Silane coupling agent (epoxy silica SH6040) | 0.599 |
| b | Polyvinyl alcohol | 2.333 |
|   | $H_2O$ | 51.301 |
|   | Isopropyl alcohol | 2.101 |
|   | Total | 100.0 (wt %) |

Next, the composition for gas barrier coating film formation prepared above was coated by gravure roll coating onto the plasma treated surface formed in the above step (1). After the coating, the assembly was passed through a drying oven of 200° C. at a speed of 200 m/min for heat treatment to form a gas barrier coating film having a thickness of 0.3 g/m² on a dry basis. Thus, a gas barrier laminated film was produced.

Example 3

(1) A 12 μm-thick biaxially stretched polyethylene terephthalate film was provided. This film was mounted on a delivery roll in a plasma chemical vapor deposition apparatus, and a 200 angstrom-thick vapor deposited film of silicon oxide was formed on the biaxially stretched nylon film on its corona treated surface under the following conditions.

(Conditions for Vapor Deposition)
Reaction gas mixing ratio; hexamethyldisiloxane:oxygen gas:helium=1.2:5.0:2.5 (unit: slm)
Ultimate pressure; $5.0 \times 10^{-5}$ mbar
Film formation pressure; $7.0 \times 10^{-2}$ mbar
Line speed; 150 m/min
Power; 35 kW Next, immediately after the formation of the 200 angstrom-thick vapor deposited film of silicon oxide, the vapor deposited film surface of silicon oxide was subjected to oxygen/argon mixed gas plasma treatment at a power of 9 kw using a mixed gas composed of oxygen gas and argon gas (oxygen gas:argon gas=7.0:2.5 (unit: slm)) at a mixed gas pressure of $6 \times 10^{-2}$ mbar and a treatment speed of 420 m/min with a glow discharge plasma generator to form a plasma treated surface having a surface tension which has been improved in surface tension by not less than 54 dynes/cm over the surface tension of the vapor deposited film surface of silicon oxide.

(2) On the other hand, according to the formulation shown in Table 3 below, an EVOH solution having a composition (a) of EVOH dissolved in a mixed solvent composed of isopropyl alcohol and ion exchanged water was provided. A previously prepared hydrolysis liquid having a composition (b) of ethyl silicate 40, isopropyl alcohol, acetyl acetone aluminum, and ion exchanged water was added to and mixed with the EVOH solution. Further, a previously prepared mixed liquid having a composition (c) of an aqueous polyvinyl alcohol solution, a silane coupling agent, acetic acid, isopropyl alcohol, and ion exchanged water was added to and mixed with the mixture to prepare a colorless transparent composition for barrier coating film formation.

TABLE 3

|   |   | (wt %) |
|---|---|---|
| a | EVOH (degree of ethylene copolymerization 29%) | 0.610 |
|   | Isopropyl alcohol | 3.294 |
|   | $H_2O$ | 2.196 |
| b | Ethyl silicate 40 (manufactured by Colcoat Co., Ltd.) | 11.460 |
|   | Isopropyl alcohol | 17.662 |
|   | Aluminum acetyl acetone | 0.020 |
|   | $H_2O$ | 13.752 |
| c | Polyvinyl alcohol | 1.520 |
|   | Silane coupling agent (epoxy silica SH6040) | 0.520 |
|   | Isopropyl alcohol | 13.844 |
|   | $H_2O$ | 35.462 |
|   | Acetic acid | 0.130 |
|   | Total | 0.130 |

Next, the composition for gas barrier coating film formation prepared above was coated by gravure roll coating onto the plasma treated surface formed in the above step (1). The assembly was then passed through a drying oven of 180° C. at a speed of 300 m/min for heat drying to form a gas barrier coating film having a thickness of 0.4 g/m² on a dry basis. Thus, a gas barrier laminated film was produced.

Example 4

(1) A 12 μm-thick biaxially stretched polyethylene terephthalate film was provided. This film was mounted on a delivery roll in a plasma chemical vapor deposition apparatus, and a 200 angstrom-thick vapor deposited film of silicon oxide was formed on the biaxially stretched polyethylene terephthalate film on its corona treated surface under the following conditions.

(Conditions for Vapor Deposition)

Vapor deposited surface; corona treated surface

Introduced gas; hexamethylenedisiloxane:oxygen gas:helium=1.0:3.0:3.0 (unit: slm)

Degree of vacuum within vacuum chamber; 2 to $6\times10^{-6}$ mbar

Degree of vacuum within vapor deposition chamber; 2 to $5\times10^{-3}$ mbar

Power supply to cooling/electrode drum; 10 kW

Line speed; 100 m/min

Next, immediately after the formation of the 200 angstrom-thick vapor deposited film of silicon oxide, the vapor deposited film surface of silicon oxide was subjected to oxygen/argon mixed gas plasma treatment at a power of 9 kw using a mixed gas composed of oxygen gas and argon gas (oxygen gas:argon gas=7.0:2.5 (unit: slm)) at a mixed gas pressure of $6\times10^{-5}$ Torr with a glow discharge plasma generator to form a plasma treated surface having a surface tension which has been improved in surface tension by not less than 54 dynes/cm over the surface tension of the vapor deposited film surface of silicon oxide.

(2) On the other hand, according to the formulation shown in Table 4 below, a mixed liquid having a composition (b) of polyvinyl alcohol, ethanol and ion exchanged water was provided. A previously prepared hydrolysis liquid having a composition (a) of ethyl silicate, ethanol, hydrochloric acid, ion exchanged water, and a silane coupling agent was added to and mixed with the mixed liquid to prepare a colorless transparent composition for barrier coating film formation.

TABLE 4

| | | (wt %) |
|---|---|---|
| a | Ethyl silicate (tetraethoxysilane) | 20.533 |
| | Ethanol | 4.80 |
| | 2 N hydrochloric acid | 0.656 |
| | $H_2O$ | 27.800 |
| | Silane coupling agent (epoxy silica SH6040) | 0.599 |
| b | Polyvinyl alcohol | 1.913 |
| | $H_2O$ | 41.486 |
| | Ethanol | 2.213 |
| | Total | 100.000 (wt %) |

Next, the composition for gas barrier coating film formation prepared above was coated by gravure roll coating onto the plasma treated surface formed in the above step (1). After the coating, the assembly was passed through a drying oven of 200° C. at a speed of 200 m/min for heat treatment to form a gas barrier coating film having a thickness of 0.3 g/m² on a dry basis. Thus, a gas barrier laminated film was produced.

Example 5

A 12 μm-thick biaxially stretched polyethylene terephthalate film was provided as a base material film and was mounted in a three-chamber plasma chemical vapor deposition apparatus.

Next, the inside of the chamber in the plasma chemical vapor deposition apparatus was evacuated.

On the other hand, hexamethyldisiloxane (hereinafter referred to as "HMDSO") which is an organosilicon compound as a starting material was volatilized in a starting material volatilization supply apparatus, and was mixed with oxygen gas supplied from a gas supply apparatus and helium as an inert gas to prepare a starting material gas.

In the first film formation chamber, a starting material gas having a mixing ratio of HMDSO:$O_2$:He=1:0:1 (unit; slm) was used. On the other hand, in the second film formation chamber, a starting material gas having a mixing ratio of HMDSO:$O_2$:He=1:10:1 (unit; slm) was used.

The third film formation chamber was not used.

The above starting material gases were provided and were introduced into the first and second film formation chambers. Subsequently, electric power was applied while transferring the 12 μm-thick biaxially stretched polyethylene terephthalate film at a line speed of 200 m/min, and a silicon oxide layer having a two-layer structure of a 60 angstrom-thick first layer and a 70 angstrom-thick second layer (total layer thickness 130 angstroms) was formed on one side (corona treated surface) of the 12 μm-thick biaxially stretched polyethylene terephthalate film to form a vapor deposited film.

(2) On the other hand, according to the formulation shown in Table 5 below, a hydrolysis liquid having a composition (a) of ethyl silicate 40, isopropyl alcohol, acetyl acetone aluminum, and ion exchanged water was provided. A previously prepared mixed liquid having a composition (b) of an aqueous polyvinyl alcohol solution, a silane coupling agent, acetic acid, isopropyl alcohol, and ion exchanged water was added to the hydrolysis liquid, and the mixture was stirred to prepare a colorless transparent composition for barrier coating film formation.

TABLE 5

| | | (wt%) |
|---|---|---|
| a | Ethyl silicate 40 (manufactured by Colcoat Co., Ltd.) | 11.460 |
| | Isopropyl alcohol | 17.662 |
| | Aluminum acetyl acetone | 0.020 |
| | $H_2O$ | 13.752 |
| b | Polyvinyl alcohol | 2.130 |
| | Silane coupling agent (epoxy silica SH6040) | 0.050 |
| | $H_2O$ | 13.844 |
| | Acetic acid | 35.462 |
| | Total | 100.000 (wt %) |

Next, the composition for gas barrier coating film formation prepared above was coated by gravure roll coating onto the plasma treated surface formed in the above step (1). Subsequently, the assembly was passed through a drying oven of 180° C. at a speed of 300 m/min for heat drying to form a gas barrier coating film having a thickness of 0.4 g/m² on a dry basis. Thus, a gas barrier laminated film was produced.

Example 6

A 12 μm-thick biaxially stretched polyethylene terephthalate film was provided as a base material film and was mounted in a three-chamber plasma chemical vapor deposition apparatus.

Next, the inside of the chamber in the plasma chemical vapor deposition apparatus was evacuated.

On the other hand, HMDSO which is an organosilicon compound as a starting material was volatilized in a starting material volatilization supply apparatus, and was mixed with oxygen gas supplied from a gas supply apparatus and helium as an inert gas to prepare a starting material gas.

In the first film formation chamber, a starting material gas having a mixing ratio of $HMDSO:O_2:He=1:0:1$ (unit; slm) was used. On the other hand, in the second film formation chamber, a starting material gas having a mixing ratio of $HMDSO:O_2:He=1:10:1$ (unit; slm) was used. Further, in the third film formation chamber, a starting material gas having a mixing ratio of $HMDSO:O_2:He=1:0:1$ (unit; slm) was used.

The above starting material gases were provided and were introduced into the first, second and third film formation chambers, respectively. Subsequently, electric power was applied while transferring the 12 μm-thick biaxially stretched polyethylene terephthalate film at a line speed of 300 m/min, and a silicon oxide layer having a three-layer structure of a 40 angstrom-thick first layer, a 45 angstrom-thick second layer and a 45 angstrom-thick third layer (total layer thickness 130 angstroms) was formed on one side (corona treated surface) of the 12 μm-thick biaxially stretched polyethylene terephthalate film to form a vapor deposited film having a multilayer structure.

(2) On the other hand, according to the formulation shown in Table 6, a mixed liquid having a composition (b) of polyvinyl alcohol, ethanol, and ion exchanged water was provided. A previously prepared hydrolysis liquid having a composition (a) of ethyl silicate, ethanol, hydrochloric acid, ion exchanged water, and a silane coupling agent was added to and mixed with the mixed liquid to prepare a colorless transparent composition for barrier coating film formation.

TABLE 6

| | | (wt %) |
|---|---|---|
| a | Ethyl silicate | 16.667 |
| | Ethanol | 3.900 |
| | 2 N hydrochloric acid | 0.532 |
| | $H_2O$ | 22.567 |
| | Silane coupling agent | 0.599 |
| b | Polyvinyl alcohol | 2.333 |
| | $H_2O$ | 51.301 |
| | Ethanol | 2.101 |
| | Total | 100.0 (wt %) |

Next, the composition for gas barrier coating film formation prepared above was coated by gravure roll coating onto the plasma treated surface formed in the above step (1). After the coating, the assembly was passed through a drying oven of 200° C. at a speed of 200 m/min for heat treatment to form a gas barrier coating film having a thickness of 0.3 g/m² on a dry basis. Thus, a gas barrier laminated film was produced.

Example 7

(1) A 12 μm-thick biaxially stretched polyethylene terephthalate film was provided as a base material film, and the film on its vapor depositing surface was subjected to plasma treatment as pretreatment for vapor deposition.

Next, the biaxially stretched polyethylene terephthalate film was mounted on a delivery roll in a winding-type vacuum vapor deposition apparatus and was unwound, and a 200 angstrom-thick aluminum oxide vapor deposited film was formed on the biaxially stretched polyethylene terephthalate film on its plasma treated surface by an electron beam (EB) heating-type vacuum vapor deposition method using aluminum as a vapor deposition source while supplying oxygen gas under the following conditions for vapor deposition.

(Conditions for Vapor Deposition)

Degree of vacuum within vapor deposition chamber: $2\times10^{-4}$ mbar

Degree of vacuum within winding chamber: $2\times10^{-2}$ mbar

Electron beam power: 25 kW

Film transfer speed: 240 m/min

Vapor deposition surface: corona treated surface

Next, immediately after the formation of the 200 angstrom-thick vapor deposited film of aluminum oxide, the vapor deposited film surface of aluminum oxide was subjected to oxygen/argon mixed gas plasma treatment at a power of 9 kw using a mixed gas composed of oxygen gas and argon gas (oxygen gas:argon gas=7.0:2.5 (unit: slm)) at a mixed gas pressure of $6\times10^{-2}$ mbar and a treatment speed of 420 m/min with a glow discharge plasma generator to form a plasma treated surface having a surface tension which has been improved in surface tension by not less than 54 dynes/cm over the surface tension of the vapor deposited film surface of aluminum oxide.

(2) On the other hand, according to the formulation shown in Table 1 above, a composition for colorless transparent gas barrier coating film formation was prepared in the same manner as in Example 1.

Next, the composition for gas barrier coating film formation prepared above was coated by gravure roll coating onto the plasma treated surface formed in the above step (1). After the coating, the assembly was passed through a drying oven of 200° C. at a speed of 300 m/min for heat treatment to form a gas barrier coating film having a thickness of 0.4 g/m² on a dry basis. Thus, a gas barrier laminated film was produced.

Example 8

(1) A 12 μm-thick biaxially stretched polyethylene terephthalate film was provided as a base material film, and the film on its vapor depositing surface was subjected to plasma treatment as pretreatment for vapor deposition. Next, the biaxially stretched polyethylene terephthalate film was mounted on a delivery roll in a winding-type vacuum vapor deposition apparatus and was unwound, and a 200 angstrom-thick aluminum oxide vapor deposited film was formed on the biaxially stretched polyethylene terephthalate film on its plasma treated surface by an electron beam (EB) heating-type vacuum vapor deposition method using aluminum as a vapor deposition agent while supplying oxygen gas under the same vapor deposition conditions as in Example 7.

Further, in the same manner as in Example 1, a plasma treated surface having a surface tension which has been improved in surface tension by not less than 54 dynes/cm over the surface tension of the vapor deposited film surface of aluminum oxide was formed.

(2) According to the formulation shown in Table 2 above, a composition for colorless transparent barrier coating film formation was prepared in the same manner as in Example 2.

Next, the composition for gas barrier coating film formation prepared above was coated by gravure roll coating onto the plasma treated surface formed in the above step (1). After the coating, the assembly was passed through a drying oven of 200° C. at a speed of 300 m/min for heat treatment to form a gas barrier coating film having a thickness of 0.4 g/m² on a dry basis. Thus, a gas barrier laminated film was produced.

Example 9

(1) A 12 μm-thick biaxially stretched polyethylene terephthalate film was provided as a base material film, and the film on its vapor depositing surface was subjected to corona treatment as pretreatment. Next, the biaxially stretched polyethylene terephthalate film was mounted on a delivery roll in a winding-type vacuum vapor deposition apparatus and was unwound, and a 200 angstrom-thick aluminum oxide vapor deposited film was formed on the biaxially stretched polyethylene terephthalate film on its corona treated surface by an electron beam (EB) heating-type vacuum vapor deposition method using aluminum as a vapor deposition source while supplying oxygen gas under the same vapor deposition conditions as in Example 8.

Further, in the same manner as in Example 7, a plasma treated surface having a surface tension which has been improved in surface tension by not less than 54 dynes/cm over the surface tension of the vapor deposited film surface of aluminum oxide was formed.

(2) According to the formulation shown in Table 3 above, a composition for colorless transparent barrier coating film formation was prepared in the same manner as in Example 3.

Next, the composition for gas barrier coating film formation prepared above was coated by gravure roll coating onto the plasma treated surface formed in the above step (1). After the coating, the assembly was passed through a drying oven of 200° C. at a speed of 200 m/min for heat treatment to form a gas barrier coating film having a thickness of 0.3 g/m² on a dry basis. Thus, a gas barrier laminated film was produced.

Example 10

(1) A 12 μm-thick biaxially stretched polyethylene terephthalate film was provided as a base material film, and a primer coating layer was provided on the film on its vapor depositing surface. Next, the biaxially stretched polyethylene terephthalate film was mounted on a delivery roll in a winding-type vacuum vapor deposition apparatus and was unwound, and a 200 angstrom-thick aluminum oxide vapor deposited film was formed on the biaxially stretched polyethylene terephthalate film on its primer layer surface by an electron beam (EB) heating-type vacuum vapor deposition method using aluminum as a vapor deposition source while supplying oxygen gas under the same vapor deposition conditions as in Example 7.

Further, in the same manner as in Example 7, a plasma treated surface having a surface tension which has been improved in surface tension by not less than 54 dynes/cm over the surface tension of the vapor deposited film surface of aluminum oxide was formed.

(2) On the other hand, in the same manner as in Example 4, a gas barrier coating film was formed to produce a gas barrier laminated film.

Example 11

(1) A 12 μm-thick biaxially stretched polyethylene terephthalate film was provided as a base material film, and a primer coating layer was provided on the film on its vapor depositing surface. Next, the biaxially stretched polyethylene terephthalate film was mounted on a delivery roll in a winding-type vacuum vapor deposition apparatus and was unwound, and a 200 angstrom-thick aluminum oxide vapor deposited film was formed on the biaxially stretched polyethylene terephthalate film on its primer layer surface by an electron beam (EB) heating-type vacuum vapor deposition method using aluminum as a vapor deposition source while supplying oxygen gas under the same vapor deposition conditions as in Example 7.

Further, in the same manner as in Example 7, a plasma treated surface having a surface tension which has been improved in surface tension by not less than 54 dynes/cm over the surface tension of the vapor deposited film surface of aluminum oxide was formed.

(2) On the other hand, in the same manner as in Example 6, a gas barrier coating film was formed to produce a gas barrier laminated film.

Example 12

(1) Base Material

A 15 μm-thick biaxially stretched nylon 6 film was provided as a film and was subjected to plasma treatment as pretreatment. The biaxially stretched nylon 6 film was then mounted on a delivery roll in a winding-type vacuum vapor deposition apparatus and was unwound, and a 200 angstrom-thick aluminum oxide vapor deposited film was formed on the biaxially stretched nylon 6 film on its plasma treated surface by an electron beam (EB) heating-type vacuum vapor deposition method using aluminum as a vapor deposition source while supplying oxygen gas under the same vapor deposition conditions as in Example 7.

Next, immediately after the formation of the 200 angstrom-thick vapor deposited film of aluminum oxide, the vapor deposited film surface of aluminum oxide was subjected to plasma treatment in the same manner as in Example 7 to form a plasma treated surface on the vapor deposited film surface of aluminum oxide.

(2) On the other hand, according to the formulation shown in Table 6 above, in the same manner as in Example 6, a gas barrier coating film was formed to produce a gas barrier laminated film.

Evaluation

The gas barrier laminated films produced in Examples 1 to 12 were measured for oxygen permeability and water vapor permeability.

(1) Measurement of Oxygen Permeability

The oxygen permeability was measured with a measuring device (model: OXTRAN) manufactured by MOCON, USA, under conditions of temperature 23° C. and humidity 90% RH.

(2) Measurement of Water Vapor Permeability

The water vapor permeability was measured with a measuring device (model: PERMATRAN) manufactured by MOCON, USA, under conditions of temperature 40° C. and humidity 90% RH.

The results of measurement were as shown in Table 7 below.

TABLE 7

|  | Oxygen permeability, cc/m²/day | Water vapor permeability, g/m²/day |
| --- | --- | --- |
| Example 1 | 0.25 | 0.33 |
| Example 2 | 0.29 | 0.30 |
| Example 3 | 0.41 | 0.85 |
| Example 4 | 0.30 | 0.45 |
| Example 5 | 0.25 | 0.35 |
| Example 6 | 0.22 | 0.31 |
| Example 7 | 0.21 | 0.30 |
| Example 8 | 0.31 | 0.52 |
| Example 9 | 0.22 | 0.41 |
| Example 10 | 0.21 | 0.30 |
| Example 11 | 0.51 | 0.62 |
| Example 12 | 0.49 | 0.61 |

The invention claimed is:

1. A gas barrier laminated film comprising a base material, a vapor deposited film of an inorganic oxide provided on the base material, and a gas barrier coating film provided on the vapor deposited film,
wherein said base material on its side where the vapor deposited film is provided, has been subjected to pretreatment or primer coating treatment,
wherein said gas barrier coating film has been formed by coating a gas barrier coating liquid onto the inorganic oxide film and then heating the coating,
wherein the vapor deposited film is composed mainly of silicon oxide and further contains, through a chemical bond, at least one compound comprising one or more elements of carbon, hydrogen, silicon and oxygen, and
wherein the content of the compound is reduced from the surface of the vapor deposited film in the thickness direction thereof toward the base material.

2. The gas barrier laminated film according to claim 1, wherein the vapor deposited film has been formed by chemical vapor deposition.

3. The gas barrier laminated film according to claim 2, wherein the vapor deposited film formed by the chemical vapor deposition has a structure comprising two or more silicon oxide layers each formed by plasma chemical vapor deposition in such a manner that at least two film formation chambers are used and, for respective chambers, two or more mixed gas compositions for film formation comprising at least: a monomer gas for film formation comprising one or more organosilicon compounds; an oxygen gas; and an inert gas, the two or more mixed gas compositions being different from each other in mixing ratio of the gas components, are used, and the each silicon oxide layer contains carbon atoms in its layer and the carbon content varies from layer to layer.

4. The gas barrier laminated film according to claim 1, wherein the vapor deposited film has been formed by physical vapor deposition.

5. The gas barrier laminated film according to claim 1, wherein the base material is formed of a biaxially stretched polyester resin film, a biaxially stretched polyamide resin film, or a biaxially stretched polyolefin resin film.

6. The gas barrier laminated film according to claim 1, wherein the pretreatment for the base material is glow discharge treatment, plasma treatment, corona treatment, or microwave treatment.

7. The gas barrier laminated film according to claim 6, wherein oxygen, argon, nitrogen, helium gas, or a mixed gas composed of two or more of them is used for the pretreatment.

8. The gas barrier laminated film according to claim 1, wherein the primer coating treatment for the base material is carried out by coating a coating liquid comprising a polyester resin, an acrylic resin, a urethane resin, and an isocyanate curing agent onto the base material.

9. The gas barrier laminated film according to claim 1, wherein the vapor deposited film on its side where the gas barrier coating film is formed, has been subjected to post treatment, and the post treatment is glow discharge treatment, plasma treatment, or microwave treatment.

10. The gas barrier laminated film according to claim 1, wherein the gas barrier coating film is formed of a hydrolyzed condensate of an alkoxide or a hydrolysate of an alkoxide produced by polycondensing, by a sol-gel process, a composition comprising one or more alkoxides represented by general formula $R^1_n M(OR^2)_m$ wherein M represents a metal atom; $R^1$ and $R^2$ represent an organic group having 1 to 8 carbon atoms; n is an integer of 0 (zero) or more; m is an integer of 1 or more; and n+m represents the valence of M, a polyvinyl alcohol and/or ethylene/vinyl alcohol.

11. The gas barrier laminated film according to claim 10, wherein the composition further comprises a silane coupling agent.

12. The gas barrier laminated film according to claim 1, wherein the gas barrier coating film has a structure of a plurality of layers.

13. The gas barrier laminated film according to claim 1, wherein a vapor deposited film of an inorganic oxide is further provided on the gas barrier coating film provided on the vapor deposited film, and the gas barrier coating film is provided on the vapor deposited film.

14. A laminated material for packaging, comprising a gas barrier laminated film according to claim 1, characterized in that a heat sealing resin layer is provided on the gas barrier coating film in the laminated film.

15. The laminated material for packaging according to claim 14, wherein the gas barrier coating film and the heat sealing resin layer are laminated onto each other by melt extrusion through a primer layer and a melt extruded resin layer.

16. The laminated material for packaging according to claim 14, wherein the heat sealing resin layer is formed of a polyolefin resin.

17. The laminated material for packaging according to claim 14, wherein an intermediate base material is provided between the gas barrier coating film and the heat sealing resin layer.

18. A packaging bag using a laminated material for packaging according to claim 14, the packaging bag comprising two laminated materials for packaging superimposed onto each other so that the heat sealing resin layer side of one of the laminated materials for packaging faces the heat sealing resin layer side of the other laminated material for packaging, the end part of the assembly having been heat sealed.

19. The gas barrier laminated film according to claim 1, wherein the surface of the inorganic oxide film is subjected to a plasma treatment, and the surface tension of the surface of the inorganic oxide film is not less than 54 dyne/cm.

20. A process for producing a gas barrier laminated film according to claim 1 comprising the steps of:
providing a base material and subjecting one side of the base material to pretreatment or primer coating treatment,
forming a vapor deposited film of an inorganic oxide on the treated surface of the base material,
subjecting the surface of the vapor deposited film of an inorganic oxide to plasma treatment, and coating a gas barrier coating liquid onto the vapor deposited film and heating the coating at 180 to 200° C. for 0.005 to 60 min. to form a gas barrier coating film.

21. The process according to claim 20, wherein the vapor deposited film has been formed by chemical vapor deposition.

22. The process according to claim 21, wherein the vapor deposited film formed by the chemical vapor deposition has a structure comprising two or more silicon oxide layers each formed by plasma chemical vapor deposition in such a manner that at least two film formation chambers are used and, for respective chambers, two or more mixed gas compositions for film formation comprising at least: a monomer gas for film formation comprising one or more organosilicon compounds; an oxygen gas; and an inert gas, the two or more mixed gas compositions being different from each other in mixing ratio of the gas components, are used, and the each silicon oxide layer contains carbon atoms in its layer and the carbon content varies from layer to layer.

23. The process according to claim 20, wherein the vapor deposited film has been formed by physical vapor deposition.

24. The process according to claim 20, wherein the pretreatment for the base material is glow discharge treatment, plasma treatment, corona treatment, or microwave treatment.

25. The process according to claim 24, wherein oxygen, argon, nitrogen, helium gas, or a mixed gas composed of two or more of them is used for the pretreatment.

26. The process according to claim 20, wherein the primer coating treatment for the base material is carried out by coating a coating liquid comprising a polyester resin, an acrylic resin, a urethane resin, and an isocyanate curing agent onto the base material.

27. The process according to claim 20, wherein the plasma treatment is carried out until the surface tension of the surface of the inorganic oxide film becomes not less than 54 dyne/cm.

* * * * *